(12) United States Patent
Sakuyama et al.

(10) Patent No.: US 6,518,163 B2
(45) Date of Patent: Feb. 11, 2003

(54) METHOD FOR FORMING BUMPS, SEMICONDUCTOR DEVICE, AND SOLDER PASTE

(75) Inventors: Seiki Sakuyama, Kawasaki (JP); Yasuo Yamagishi, Kawasaki (JP); Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/746,336

(22) Filed: Dec. 26, 2000

(65) Prior Publication Data

US 2001/0008310 A1 Jul. 19, 2001

(30) Foreign Application Priority Data

Dec. 27, 1999 (JP) .......................................... 11-368924
May 16, 2000 (JP) .......................................... 2000-143442
Aug. 23, 2000 (JP) .......................................... 2000-251909
Nov. 29, 2000 (JP) .......................................... 2000-363235

(51) Int. Cl.$^7$ ............................................. H01L 21/44
(52) U.S. Cl. ....................................... 438/613; 257/738
(58) Field of Search ............................. 438/613; 257/772, 257/738

(56) References Cited

U.S. PATENT DOCUMENTS 6,030,889 A * 2/2000 Aulicino et al. ............ 438/613
6,085,968 A * 7/2000 Swindlehurst et al. ...... 228/254
6,109,507 A * 8/2000 Yagi et al. ............. 228/180.22
6,319,810 B1 * 11/2001 Ochiai et al. ............... 438/616

FOREIGN PATENT DOCUMENTS

JP          7-273439       10/1995
JP          11-340270      12/1999

* cited by examiner

Primary Examiner—David Nelms
Assistant Examiner—Quoc Hoang
(74) Attorney, Agent, or Firm—Armstrong, Westerman & Hattori, LLP

(57) ABSTRACT

The present invention relates to a bump formation method, comprising the steps of providing a mask, in which a plurality of openings have been formed corresponding to a plurality of electrode pads, to a substrate provided with this plurality of electrode pads, filling the openings with a solder paste, and heat treating the solder paste. The solder paste contains a solder powder. This solder powder is one that contains no more than 10 wt % particles whose diameter is greater than the thickness of the mask and no more than 1.5 times this thickness. Preferably, this solder powder is one that contains no more than 10 wt % particles whose diameter is greater than 40% of the diameter of the openings, or one that contains no more than 30 wt % particles whose diameter is 40 to 100% the thickness of the mask.

34 Claims, 13 Drawing Sheets

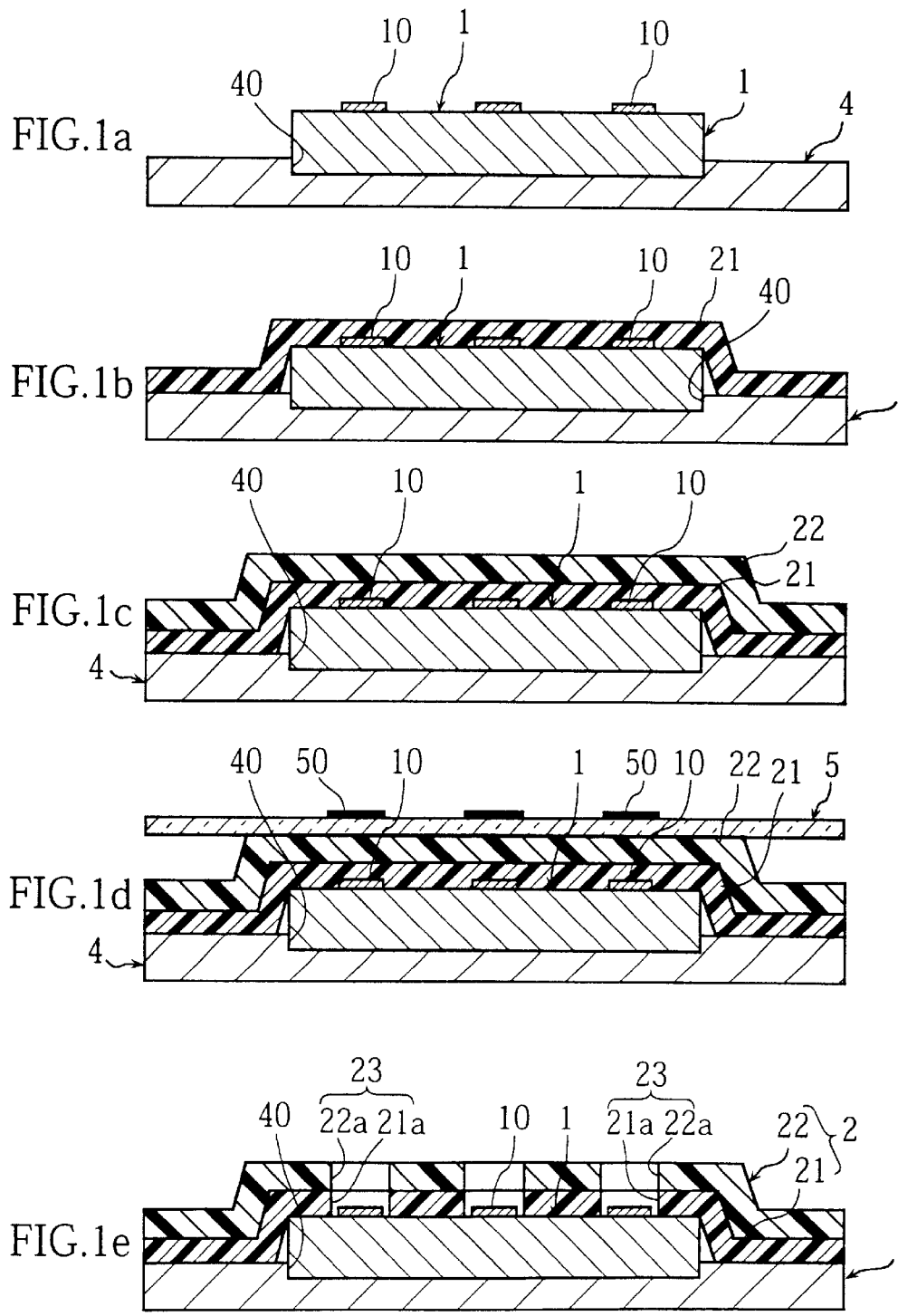

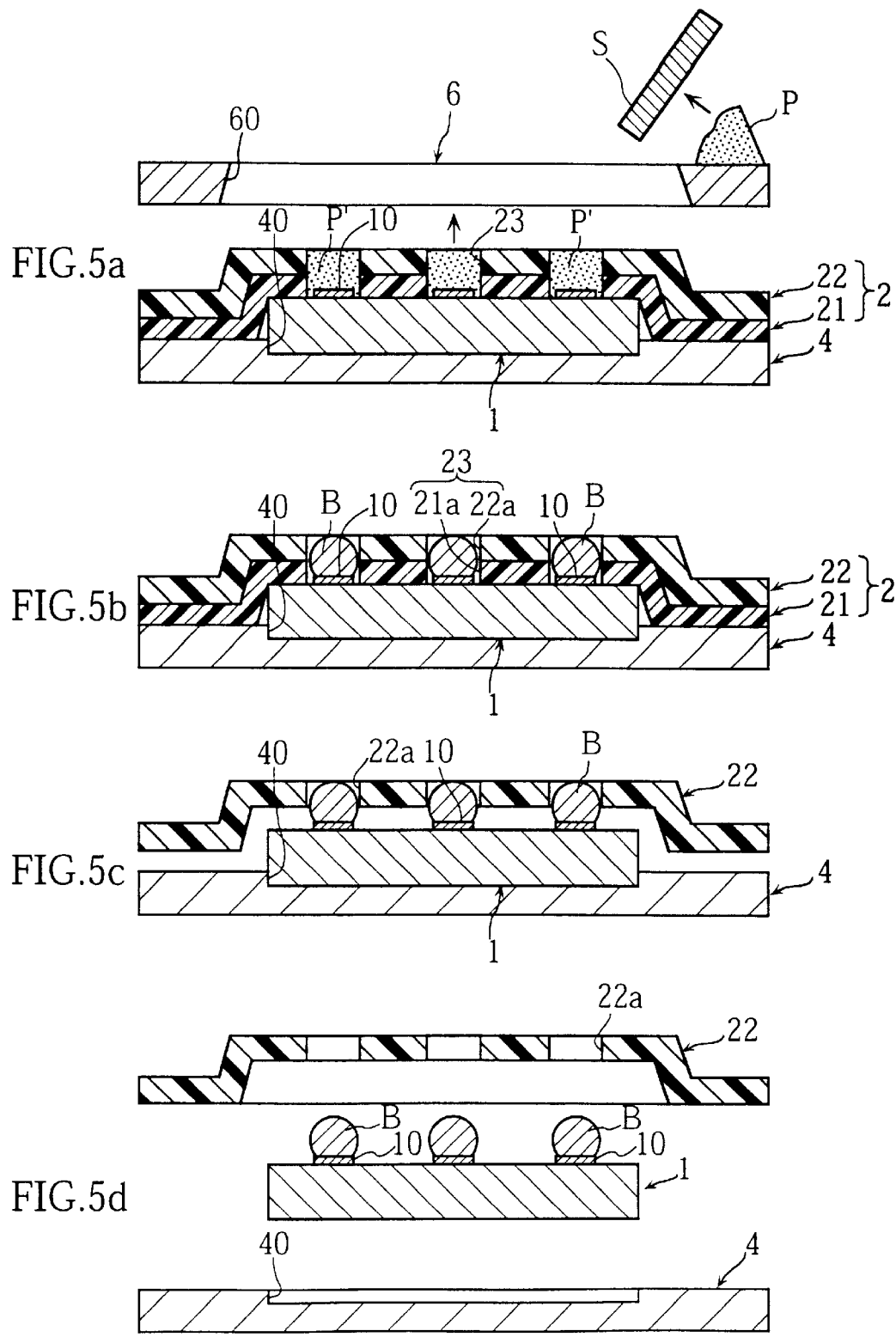

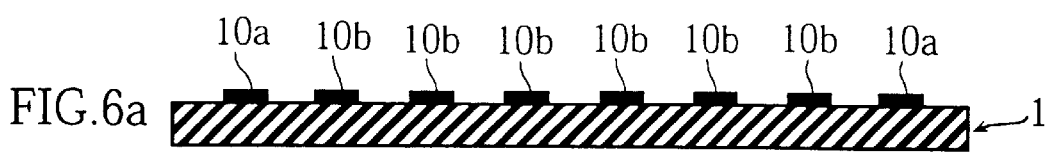
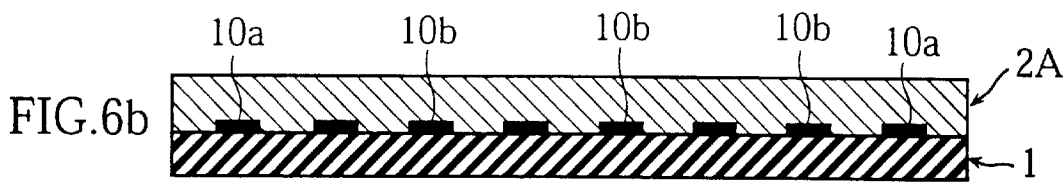
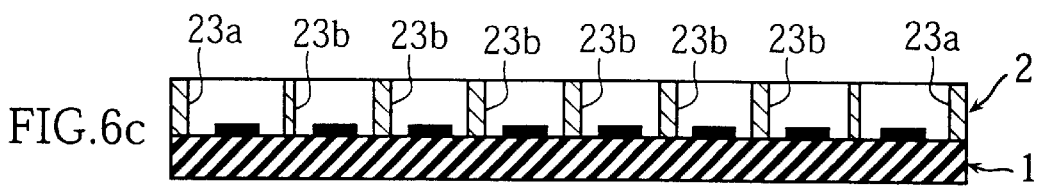
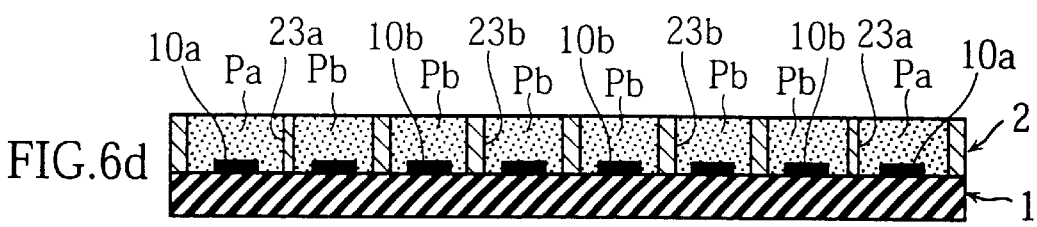
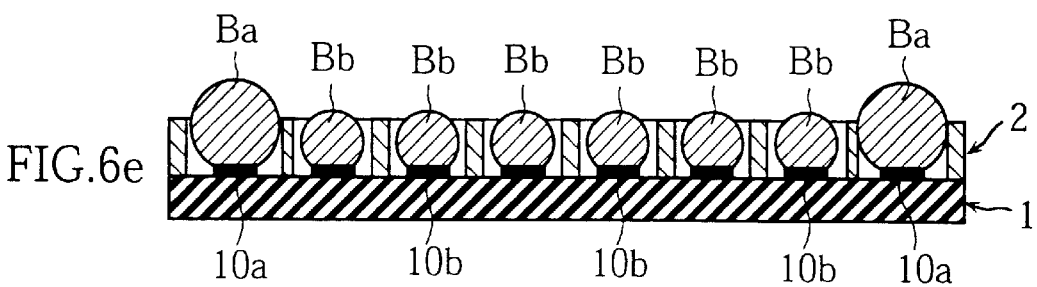
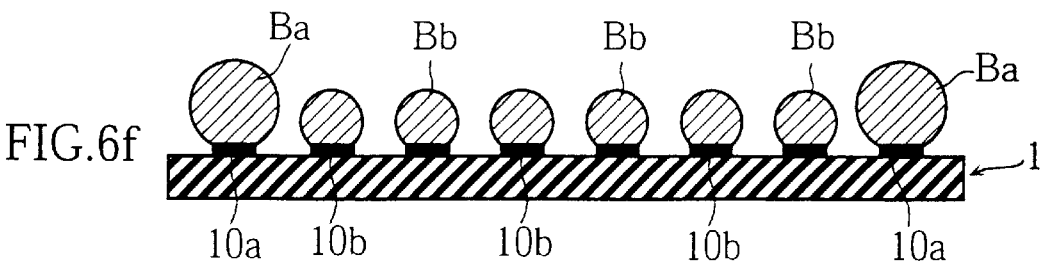

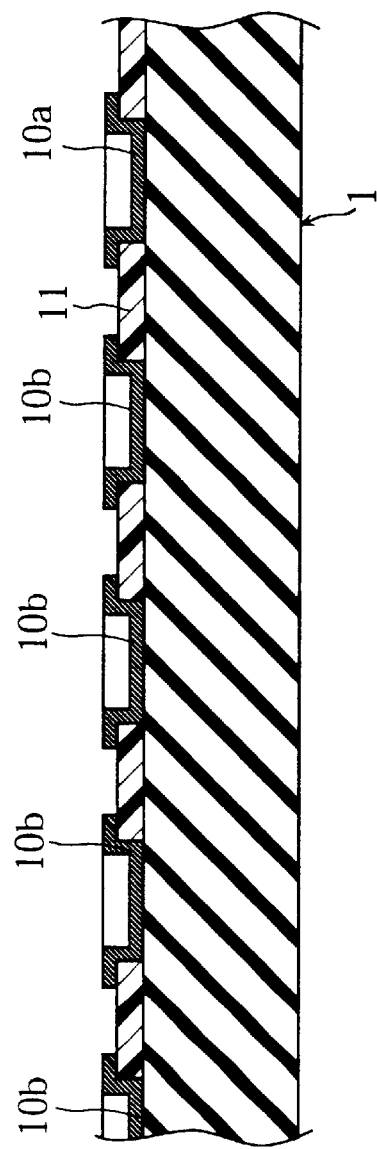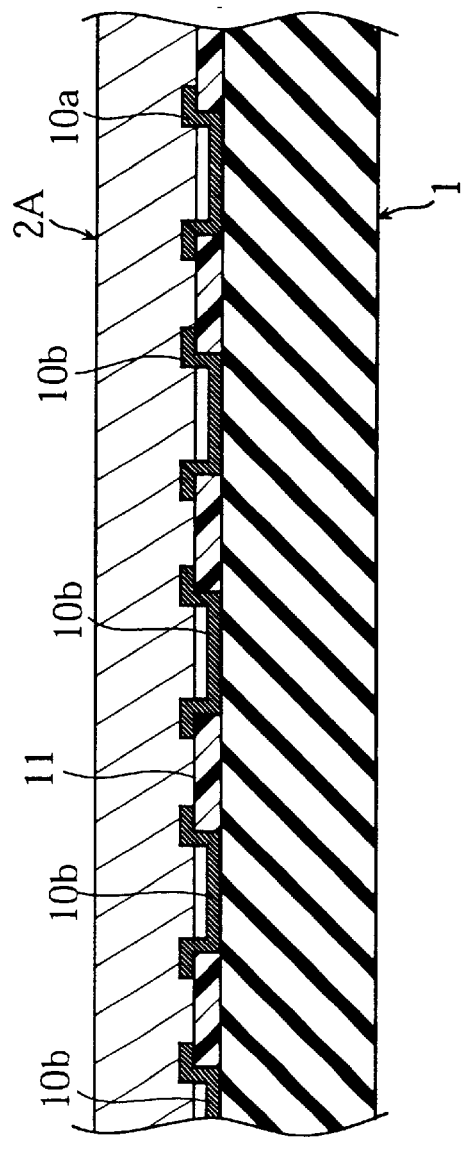

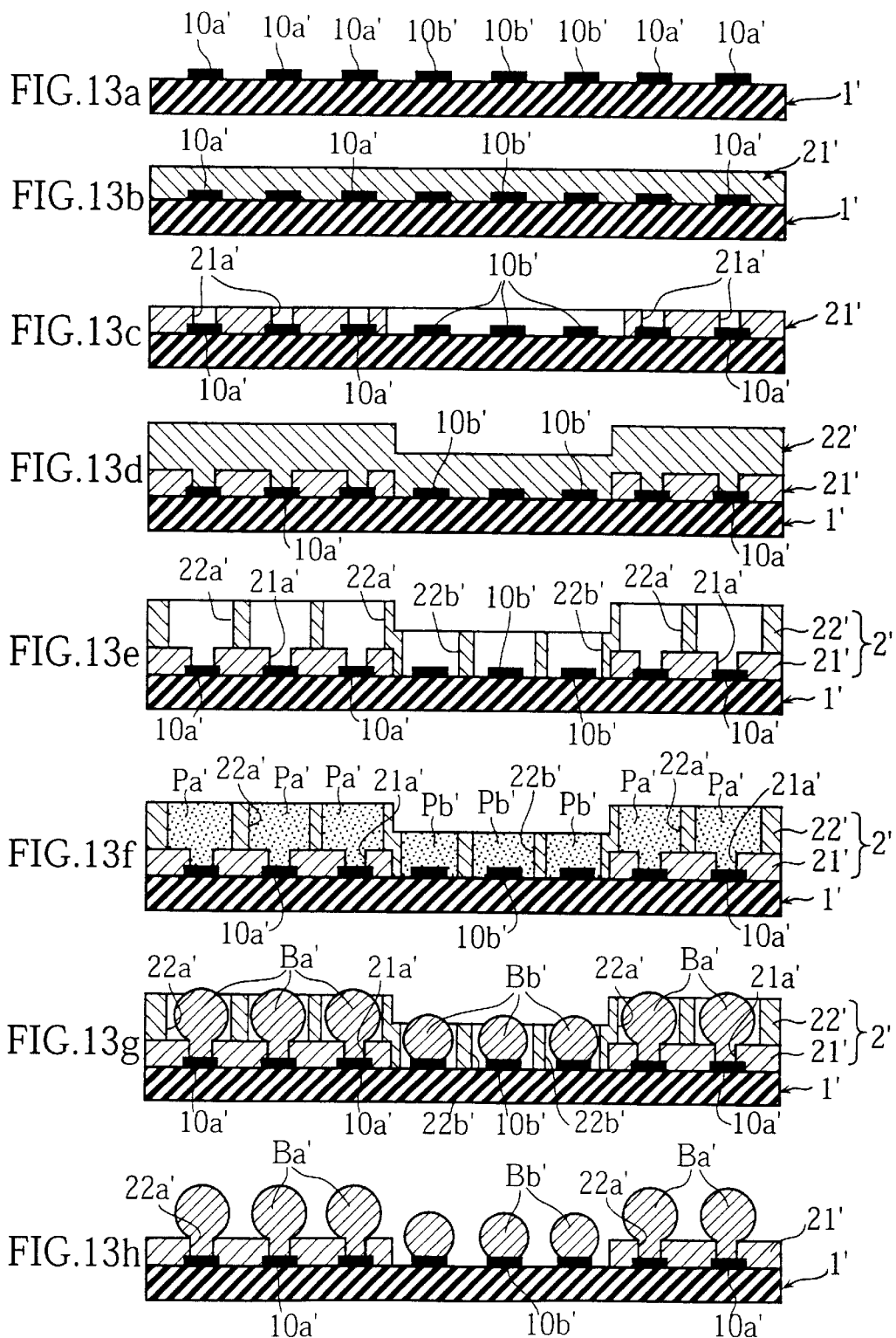

METHOD FOR FORMING BUMPS, SEMICONDUCTOR DEVICE, AND SOLDER PASTE

BACKGROUND OF THE INVENTION

1. Field of the Invention

The present invention relates to a method for forming bumps on electrode pads provided on a substrate, to an electronic component on which bumps are formed, and to a solder paste.

2. Description of the Related Art

There has been a growing need for higher mounting density with electronic components in recent years, and bare chip mounting methods have been attracting attention. There are two types of bare chip mounting method: a face-up method involving wire bonding, and a face-down method featuring metal bumps. Face-down mounting is becoming more and more prevalent today. A benefit of connecting with metal bumps by face-down method is the lower resistance of the connection. On the other hand, numerous demands are imposed on this method, such as lower cost, ensuring a precise bump height in order to achieve stable connection reliability, and forming bumps at a fine pitch corresponding to the electrode pads of a semiconductor chip.

Plating and vapor deposition are just two conventional bump formation methods. These bump formation methods require a tremendous equipment investment, and make it difficult to control bump height and metal composition, among other problems. In view of this, engineers have been taking a closer look at printing, which allows a metal paste to be supplied at low cost.

One type of printing method makes use of a metal mask. In addition, as disclosed in JP-A-7-273439 and JP-A-11-340270 and elsewhere, there is also a method that utilizes a resin mask. When a metal mask is used, one in which openings have been formed corresponding to the locations where the electrode pads are formed is placed over a substrate. When a resin mask is used, a resin layer is formed over a substrate, after which the portions corresponding to the electrode pads are removed to form openings. The two methods are similar in that after this, a squeegee is used to push a solder paste applied over the mask into the openings and thereby form bumps. When a metal mask is used, it is removed after the openings have been filled with the solder paste, but when a resin mask is used, it is removed as needed after the bumps have been formed.

However, if a large proportion of the solder powder that makes up the solder paste has a large particle diameter (such as an average particle diameter of 30 to 40 $\mu$m), there tends to be variance in the size of the bumps that are formed. Causes of this include the fact that some of the solder powder that has filled the openings is wiped away when the squeegee is moved back and forth over the mask, and that when the metal mask is removed after the openings have been filled with the solder paste, the solder paste clinging to the inner walls of the openings ends up being taken away with the mask.

To avoid this problem it is necessary to use a solder powder with a small proportion of particles whose diameter is large. For instance, it is good to use a solder powder with a large proportion of particles whose diameter is no more than ⅓ the thickness of the mask (when the thickness of masks commonly in use is considered, this is substantially a particle diameter of 15 $\mu$m or less).

Meanwhile, methods for producing a solder powder include disc atomizing and gas atomizing. With these methods it is difficult to stably produce a powder with a small particle diameter. Accordingly, the current approach is to produce a powder having a particle size distribution within a certain range, and then separate and collect the fines. However, not only does separating out the fines require considerable labor, it is also difficult to collect a large quantity of fines. For instance, with existing technology a solder powder of 20 $\mu$m or less only accounts for about 20% of the total powder, which is also disadvantageous in terms of cost. Also, because a fine powder with a small particle size has a larger specific surface area and is therefore oxidized more readily, the solder paste made up of this solder powder has a shorter life.

SUMMARY OF THE INVENTION

The bump formation method provided by the first aspect of the present invention is a method for forming bumps on a substrate provided with a plurality of electrode pads, comprising the steps of providing a mask having a plurality of openings corresponding to the plurality of electrode pads, filling each of the openings with a solder paste, and heat treating the solder paste, wherein the solder paste contains solder powder and a flux vehicle, and the solder powder contains no more than 10 wt % particles whose diameter is greater than the thickness of the mask and no more than 1.5 times this thickness.

Unless otherwise specified, the term "substrate" as used in the present invention includes all substrates on which electrode pads are formed, which of course includes circuit substrates and silicon wafers, but also includes semiconductor chips and so forth. When an opening is not circular, "open diameter" refers to the diameter of a circle having a surface area equivalent to the surface area of the opening.

The solder paste used in this bump formation method must have a small proportion of solder powder with a relatively large particle diameter as compared to the thickness of the mask. This reduces the danger that the solder paste filling the openings will be wiped away when the mask is coated with the solder paste and a squeegee is then moved back and forth over the mask in an effort to pack the insides of the openings with the solder paste. Also, when a metal mask is used, there will be less danger that the solder paste clinging to the inner walls of the openings will be taken away with the metal mask when the mask is removed after the openings have been filled with the solder paste. Accordingly, there will be less variance in the bumps if they are formed by the above method.

The smaller is the quantity of solder powder within the above-mentioned particle diameter range, the more pronounced this effect will be, and the ideal proportion for such solder powder is therefore 0 wt %. For the above effect to be realized even better, it is preferable to use no more than 10 wt % solder powder having a particle diameter of 40% or more of the open diameter of the openings.

In a preferred embodiment, the solder powder contains at least 30 wt %, and preferably at least 50 wt %, particles whose diameter is 40 to 100% of the mask thickness.

This solder paste has a larger proportion of solder powder of suitable particle size as compared to the mask thickness, and a smaller proportion of solder powder of relatively small particle size. If the thickness of the mask is about 50 to 100 $\mu$m, for example, then the proportion of solder powder having a particle diameter of 20 $\mu$m or less is small. As discussed above, it used to be that preparing a solder powder having a particle diameter of 20 µm or less not only was labor intensive, but also produced a low yield and was expensive, but if the proportion of solder powder with such a particle diameter is reduced, then these drawbacks are automatically ameliorated. Also, if the proportion of solder powder with a small particle diameter is small, the solder powder as a whole is not as susceptible to oxidation, so another advantage is a longer life for the solder paste.

The average particle diameter of the solder powder as a whole should be suitably determined as dictated by the thickness of the mask, the diameter of the openings formed therein, and so on, but is 5 to 20 µm, for example.

One or more elements selected from the group consisting of tin, lead, silver, antimony, bismuth, copper, indium, and zinc can be used favorably as the solder component that makes up the solder powder, for example. More specifically, 63%Sn-Pb (melting point: 183° C.), Sn-3.5%Ag (melting point: 221° C.), 5% Sn-Pb (melting point: 315° C.), and the like can be used to advantage.

Meanwhile, the flux vehicle can contain rosin, an activator, and a solvent.

The primary role of the rosin is to increase the adhesion of the solder paste. A variety of known rosins can be used, examples of which include polymerized rosin, hydrogenated rosin, and esterified rosin.

The primary role of the activator is to remove the oxidation film formed on the surface of the electrode pads or on the surface of the individual solder powder particles when the solder paste is heat treated. An organic acid or an organic amine can be used, for example, as this activator. This is because, in most cases, an organic acid has carboxyl groups in the skeleton of the molecular structure, while an organic amine has amino groups in the skeleton of the molecular structure, so both are able to remove the oxidation film from the solder powder surface and the electrode surface in the solder paste.

At least one type of organic acid or organic amine selected from the group consisting of sebacic acid, succinic acid, adipic acid, glutaric acid, triethanolamine, and monoethanolamine is used as the activator. For the action of the activator to be maximized, it is preferable to use one that decomposes or vaporizes near the melting point of the solder. Meanwhile, at temperatures below the melting point of the solder, the activator in the solder paste must be uniformly dispersed in the paste in order for its oxidation film removal effect to be maximized, so the use of one that is miscible with the solvent or rosin is preferred. Accordingly, when an Sn-Ag-based solder is used, for instance, the use of sebacic acid (decomposition temperature: 230 to 290° C.), succinic acid (decomposition temperature: 200 to 250° C.), adipic acid (decomposition temperature: 230 to 280° C.) or the like is preferred.

The amount of activator contained in the solder paste is 0.1 to 2 wt %, for example. If the activator content is too high, it will lead to elevated viscosity of the solder paste, the fluidity of the solder paste will suffer, and it will be difficult to fill the openings in the mask. On the other hand, if the activator content is too low, the oxidation film cannot be sufficiently removed from the solder powder, etc.

The primary role of the solvent is to adjust the viscosity of the solder paste, which is adjusted to between 100 and 400 Pa·s, for example. If the viscosity of the solder paste is lower than 100 Pa·s, when the openings are filled with the solder paste, the resin part (rosin) will be pushed out of the openings, and the wettability of the solder will be impaired. On the other hand, if the viscosity of the solder paste is over 400 Pa·s, it will be difficult for the solder paste to flow into the openings.

It is preferable for the solvent to comprise a combination of a first solvent having a boiling point lower than the melting point of the solder powder, and a second solvent having a boiling point higher than the melting point of the solder powder.

With such a combination, when the solder paste is heated, the first solvent will vaporize before the solder powder melts, and the second solvent will vaporize after the solder powder has begun to melt. The result of this is that the first and second solvents ensure that there is enough solvent to adjust the viscosity of the solder paste, while allowing a reduction in the amount of solvent that vaporizes after the solder powder has begun to melt. Consequently, less heat is robbed from the solder as heat of vaporization during the vaporization of the solvent, and there is less drop in solder temperature during heating, which minimizes the problem of unmelted solder powder remaining behind.

Meanwhile, once the solder begins to melt, the second solvent begins to vaporize, but a specific amount of the second solvent remains for a certain length of time thereafter. A specific amount of solvent needs to remain when the solder is melted in order to maintain the fluidity of the rosin or other resin component and to keep the activator from being taken away along with the vaporization of the solvent, and thereby allow the activator to fine its way into all the parts of the solder and act most effectively. This is the role of the second solvent.

Thus, combining a first solvent with a second solvent ensures that the openings in the mask will be properly filled with solder paste of the desired viscosity, and the activator effectively acts to cause the solder powder particles to fuse together, allowing solder bumps with little variance to be formed. As a result, it is possible to form solder bumps more precisely, and it is possible to form solder bumps accurately at a fine pitch on electrode pads provided at a fine pitch, as is the case with semiconductor elements and so forth.

For this effect to be achieved in the best way, the first solvent is preferably one that has a boiling point 5 to 50° C. lower than the melting point of the solder powder, and the second solvent is preferably one that has a boiling point 5 to 50° C. higher than the melting point of the solder powder. In other words, if the boiling point of the first solvent is too low, the first solvent may evaporate at room temperature, causing the viscosity of the solder paste to rise, but if the boiling point is too high, it will be close to the melting point of the solder powder, making it impossible to sufficiently reduce the amount of heat robbed by the vaporization of the first solvent when the solder powder melts. Meanwhile, if the boiling point of the second solvent is too high, it will be impossible to sufficiently vaporize the second solvent in the course of heating the solder paste, but if this boiling point is too low, it will be close to the melting point of the solder powder, the activator will be taken away as the second solvent vaporizes, and the activator will not adequately fulfill its function.

The types of first and second solvents used are determined by the melting point of the solder, and mainly by the composition of the solder powder. Table 1 below gives typical solder powder compositions and suitable compositions for the first and second solvents.

TABLE 1

| Composition (melting point/° C.) | Solder powder | |
|---|---|---|
| | First solvent Name (boiling point/° C.) | Second solvent Name (boiling point/° C.) |
| 63% Sn—Pb (183) | ethylene glycol monoethyl ether (135.0) | ethylene glycol diacetate (190.5) |
| | n-butyl ether (140.9) | propylene glycol (188.2) |
| | diethylene glycol dimethyl ethyl ether (145.0) | 2-methyl-2,4-pentanediol (197.0) |
| | ethylene glycol monomethyl ether acetate (145.1) | ethylene glycol (197.7) |
| | methyl phenyl ether (153.9) | ethylene glycol dibutyl ether (203.6) |
| | ethylene glycol monoethyl ether acetate (156.8) | ethylene glycol monohexyl ether (208.3) |
| | diethylene glycol dimethyl ether (159.6) | n-butyl phenyl ether (213.3) |
| | methoxymethoxyethanol (167.5) | diethylene glycol monoethyl ether acetate (217.4) |
| | ethyl phenyl ether (170.1) | α-terpenol (218.0) |
| | propylene glycol monobutyl ether (171.1) | dipropylene glycol (229.2) |
| | | 1-butoxyethoxypropanol (229.4) |
| | ethylene glycol monobutyl ether (171.2) | diethylene glycol monobutyl ether (230.4) |
| Sn-3.5% Ag (221) | ethylene glycol isoamyl ether (181.0) | dipropylene glycol (229.2) |
| | | 1-butoxyethoxypropanol (229.4) |
| | diethylene glycol diethyl ether (186.0) | diethylene glycol monobutyl ether (230.4) |
| | ethylene glycol monoacetate (187.0) | ethylene glycol monophenyl ether (237.0) |
| | propylene glycol (188.2) | 1,5-pentanediol (242.5) |
| | dipropylene glycol monomethyl ether (190.0) | tripropylene glycol monomethyl ether (243.0) |
| | ethylene glycol diacetate (190.5) | diethylene glycol (245.0) |
| | ethylene glycol monobutyl ether acetate (191.5) | diethylene glycol monobutyl ether acetate (246.8) |
| | diethylene glycol monomethyl ether (194.2) | diethylene glycol monoacetate (250.0) |
| | diethylene glycol monoethyl ether (195.0) | diethylene glycol dibutyl ether (254.6) |
| | 2-methyl-2,4-pentanediol (197.0) | ethylene glycol benzyl ether (256.0) |
| | 3,4-hexylene glycol (197.1) | ethylene glycol monophenyl ether acetate (259.7) |
| | dipropylene glycol monoethyl ether (197.8) | glyceryl monobutyrate (269.0) |
| | ethylene glycol dibutyl ether (203.6) | |
| | ethylene glycol monohexyl ether (208.3) | |
| | n-butyl phenyl ether (213.3) | |
| 5% Sn—Pb (315) | glyceryl monobutyrate (269.0) | benzyl benzoate (323.0) |
| | dimethyl phthalate (283.7) | dibutyl phthalate (339.0) |
| | diethyl phthalate (302.0) | dioctyl phthalate (340.0) |
| | | ethyl abietate (350.0) |
| | | amyl stearate (360.0) |

It is preferable for the first and second solvents each to be contained in an amount of 2 to 6 wt % in the solder paste in order for them to fulfill their above-mentioned roles as the first and second solvents.

A thixotropic agent may be admixed to the flux vehicle in order to impart shape retention properties to the solder paste. Any of a variety of known thixotropic agents can be used, such as hardened castor oil or hydroxystearic acid.

All of the components used as constituent components of the solder paste preferably either contain no halogen elements or alkali metal elements, or contain these in extremely small amounts. This is because if halogen elements or alkali metal elements remain after the solder bumps have been formed, corrosion can cause degradation of the semiconductor element, or migration can cause shorting between the electrodes. It is particularly favorable for the halogen element and alkali metal element content in the flux vehicle to be no more than 100 ppm.

In a preferred embodiment, the mask is provided over the substrate through the steps of forming a first cover layer over the substrate, forming a second cover layer over this first cover layer, and forming the plurality of openings in the first cover layer and the second cover layer by exposing these to light in a pattern corresponding to the plurality of electrode pads and developing with an etchant, and the first cover layer is formed from a material that will be dissolved by the etchant used to develop the second cover layer, with the etching of the first cover layer being carried out simultaneously with the developing of the second cover layer.

With this bump formation method, just the portion of the second cover layer corresponding to the electrode pads is selectively removed in the developing that follows optical exposure, and first openings that constitute the above-mentioned openings are formed in the second cover layer. Meanwhile, because the first cover layer is formed from a material that will be dissolved by the etchant used to develop the second cover layer, the first cover layer is also etched at the same time by the above-mentioned etchant. Here, since the first cover layer is formed underneath the second cover layer, the second cover layer in which the first openings are formed functions as an etching mask for the first cover layer. Therefore, just the portion of the first cover layer corresponding to the electrode pads and corresponding to the first openings formed in the second cover layer is selectively removed to form second openings that constitute the above-mentioned openings. Thus, with the above bump formation method, there is no need for the first cover layer and the second cover layer to be etched separately in the formation of the openings, which is advantageous in that the work is more efficient.

Unless otherwise specified, the term "optical exposure" encompasses irradiation with X-rays, an electron beam, or the like.

The material used to form the first cover layer should be one that will be dissolved by the etchant used in the developing of the second cover layer, and may be suitably selected as dictated by the type of etchant being used.

The material used to form the second cover layer is a macromolecular compound that is photosensitive, or a mixture of a photosensitive compound and another compound, for example, but can be either a negative type in which the portion irradiated with light is cured, or a positive type in which the portion irradiated with light is decomposed. The meaning of the word "photosensitive" here is not limited to the property of undergoing curing (reaction) or decomposition (reaction) when irradiated with light, and also encompasses the property of undergoing curing (reaction) or decomposition (reaction) when irradiated with an electron beam, X-rays, or the like.

Examples of materials with which a negative type cover layer can be formed include polymerizable vinyl group-containing vinyl esters, styrene, acrylic esters, methacrylic esters, and other such monomers, as well as oligomers of these monomers, unsaturated polyester resins, and urea acrylates, and acrylic monomers and oligomers having polymerizable unsaturated double bonds. Naturally, a negative type cover layer may be formed from just a photosensitive compound, or it may be formed from a mixture of a photosensitive compound and another compound, such as an acrylic-, epoxy-, or imide-based macromolecular compound.

Examples of materials with which a positive type cover layer can be formed include macromolecular compounds having ether bonds that readily undergo photolysis (such as polyethylene oxide, cellulose, and polyacetal), as well as polyethylene and other macromolecular compounds that readily produce radicals under optical irradiation, and mixtures of low molecular weight compounds that are decomposed by optical irradiation, such as diazo compounds, with another compound.

In a preferred embodiment, the first cover layer is formed from a material containing a macromolecule that is water-soluble or readily dissolves in an alkaline aqueous solution.

With this bump formation method, the second cover layer can be removed at the same time if at least the first cover layer is dissolved by water or an aqueous solution such as an alkaline aqueous solution. Specifically, if the second cover layer is formed from a material containing a macromolecule that is water-soluble or readily dissolves in an alkaline aqueous solution just as is the first cover layer, then the second cover layer can also be dissolved away at the same time by water or an aqueous solution such as an alkaline aqueous solution. On the other hand, if the second cover layer is formed from a material that contains as its main component a macromolecule has poor solubility in water or in an alkaline aqueous solution, then just the first cover layer can be dissolved. Since the first cover layer is formed underneath the second cover layer, once the first cover layer is dissolved, the second cover layer will no longer be attached to the substrate. In this state, the second cover layer can be easily removed in the form of a film, even if the second cover layer itself is not dissolved. Since there is no need to dissolve the second cover layer in this case, an advantage is that less water or aqueous solution such as an alkaline aqueous solution is used. Therefore, in this respect it is preferable to form the second cover layer from a material whose main component is a macromolecular that has poor solubility in water or in an alkaline aqueous solution.

When the second cover layer has poor solubility in water or in an alkaline aqueous solution, it is preferable for the second cover layer to contain a macromolecule based on an acrylic (such as an acrylic ester), an epoxy (such as a bisphenol A type), or an imide (such as a bismaleimide type of polyimide). Naturally, a combination of these macromolecules may also be used.

The macromolecule that is water-soluble or readily dissolves in an alkaline aqueous solution and is contained in the first cover layer can be a natural macromolecule such as animal-derived gelatin or vegetable-derived starch, a semi-synthetic macromolecule such as a starch derivative or a cellulose derivative, as well as various other macromolecules. Homopolymers (straight polymers) and copolymers can both be used as synthetic macromolecules. Examples of homopolymers include polyvinyl alcohol, polyvinyl pyrrolidone, and other vinyl-based polymers, polyacrylamide, polyacrylic acid, and other acrylic polymers, and polyethylene oxide. Examples of copolymers include random copolymers such as a partially saponified polyvinyl acetate, block copolymers such as poly(styrene-ethylene oxide), and graft copolymers such as poly (ethylene-vinyl alcohol)-g-(ethylene oxide).

In a preferred embodiment, the plurality of electrode pads are divided into a plurality of groups, and the mask is formed through the steps of forming a cover layer so as to cover the plurality of electrode pads, and forming the plurality of openings in this cover layer in a pattern corresponding to the plurality of electrode pads, with the volume of these openings being different for each group.

With this bump formation method, the amount of solder paste filling the various openings is different for each group of electrode pads. Accordingly, it is possible for the bums formed on the electrode pads to be different sizes for each group.

For example, if first openings formed corresponding to the various members of a first electrode pad group out of a plurality of groups are larger in volume than second openings formed corresponding to the various members of a second electrode pad group out of a plurality of groups, then the amount of solder paste filling the first openings will be greater than the amount of solder paste filling the second openings. Accordingly, when the bumps are finally formed, those bumps formed on the first electrode pads will be larger than the bumps formed on the second electrode pads.

In a preferred embodiment, the plurality of electrode pads are divided into a group comprising a plurality of first electrode pads and a group comprising a plurality of second electrode pads, each of the first electrode pads being formed in a surface area smaller than each of the second electrode pads, and the plurality of openings include a plurality of first openings formed in a pattern corresponding to the plurality of first electrode pads, and a plurality of second openings each smaller in volume than each of the first openings and formed in a pattern corresponding to the plurality of second electrode pads.

With this bump formation method, if the thickness of the cover layer is uniform under conditions in which no molten solder is in contact with the inner walls of the openings when the solder is melted, for instance, then the solder bumps will be taller when formed in openings of greater volume. In other words, the larger is an opening, the greater is the amount of solder paste that fills it, so the bump formed on that electrode pad will be taller. If an electrode pad is small, then there will be less contact surface area between the electrode pad and the bump, and the bump will be closer to spherical in shape, so the height of the bumps can be varied in this respect as well.

Thus, if openings of different size are formed in the cover layer, and the surface area of the electrode pads is also different, then a plurality of bump groups of varying distance from the electrode pads to the bump tops can be formed simultaneously and in the same step.

The above description is of an example in which two types of bump with different heights are formed, but of course the present invention can also be applied to when three or more types of bump of different heights are formed. For instance, in addition to first and second openings of different open volume, third openings with yet a different volume may be provided, and of course fourth or further openings may also be provided.

The cover layer is formed, for example, by coating with a molten resin, or laying down a resin film. However, forming the cover layer by laying down a resin film is advantageous, not only because the step of forming the cover layer is easier, but also because it is possible to form a cover layer of uniform thickness with ease.

The cover layer can be made up of a highly insulating resin based on a resin such as polymethyl methacrylate, polyacrylate, or polymethyl isopropenyl ketone, and is preferably made up of a photosensitive material containing a photopolymerizable monomer such as a polyfunctional acrylate.

In a preferred embodiment, wherein the plurality of electrode pads include a plurality of first electrode pads and a plurality of second electrode pads, and the plurality of openings include a plurality of first openings, a plurality of second openings, and a plurality of third openings, and the mask is formed through the steps of forming a first cover layer by covering the plurality of first electrode pads and exposing the plurality of second electrode pads, forming the plurality of first openings in this first cover layer in a pattern corresponding to the plurality of first electrode pads, forming a second cover layer so as to cover the first cover layer and the plurality of second electrode pads, forming the plurality of second openings in the second cover layer in a pattern corresponding to the plurality of second electrode pads, and forming the plurality of third openings in a pattern corresponding to the plurality of first openings.

With this bump formation method, a mask is constituted by the first cover layer and the second cover layer in the region where the first electrode pads are formed, and the mask is constituted by only the second cover layer in the region where the second electrode pads are formed. The first and third openings are provided over the first electrode pads, and the second openings are formed over the second electrode pads. Since the second and third openings are both formed in the second cover layer, if the thickness of the second cover layer is uniform, the depth of these openings will be the same. Accordingly, the openings formed over the first electrode pads are deeper than those formed over the second electrode pads by the depth of the first openings (the thickness of the first cover layer). Therefore, when the above-mentioned mask is used, the amount of solder paste resting on the first electrode pads will be greater than that resting on the second electrode pads, and the solder bumps formed thereon will also be taller. As a result, with this bump formation method, it is possible to form a plurality of bump groups with significantly varying distances from the substrate surface to the bump tops.

The third openings are preferably formed larger than the second openings. If they are, then the amount of solder paste resting on the first electrode pads will be larger than the amount of solder paste resting on the second electrode pads, and as a result the height of the bumps formed on the first electrode pads can be significantly different from the height of the bumps formed on the second electrode pads.

In a preferred embodiment, the third openings are formed with a larger open surface area than the first openings, and there is further included a step of selectively removing just the second cover layer, with the first cover layer left on the substrate.

With this bump formation method, the first cover layer, which has first openings with a smaller open surface area than the third openings, remains after the bumps have been formed, so bumps in which a spherical portion, example, protrudes from the surface of the first cover layer are formed over the first electrode pads such that they are raised up to the remaining first cover layer. Meanwhile, spherical bumps, for example, are formed directly on the second electrode pads. Accordingly, a height difference can be achieved between the bumps over the first electrode pads and the bumps over the second electrode pads.

The first and second cover layers are formed, for example, by coating with a molten resin, or laying down a resin film. However, forming the cover layers by laying down a resin film is advantageous, not only because the step of forming the cover layer is easier, but also because it is possible to form a cover layer of uniform thickness with ease.

The first cover layer can be made up of a highly insulating resin based on a resin such as epoxyacrylate, epoxy, and polyimide.

The second cover layer can be made up of a highly insulating resin based on a resin such as polymethyl methacrylate, polyacrylate, or polymethyl isopropenyl ketone, and is preferably made up of a photosensitive material containing a photopolymerizable monomer such as a polyfunctional acrylate. The first cover layer must be a material that exhibits chemical properties different from those of the second resin film so that it will not be etched by the etchant when the second and third openings are formed in the second resin film. For example, the first resin film can be made up of a material such as epoxyacrylate, epoxy, and polyimide. If it is, not only will the step of forming the resin film be easier, but it will also be possible to form a resin film of uniform thickness with ease.

In a preferred embodiment, the filling of the openings with solder paste is carried out through the steps of holding the substrate on a substrate support, providing squeegeeing helper means for lessening the difference between the height position of the mask and the height position of the periphery of the substrate, readying solder paste on the mask or the squeegeeing helper means, and moving a squeegee to push the solder paste down into the openings.

The filling of the openings with the solder paste need only comprise the various steps listed above, and does not necessarily have to follow the above order. For instance, the openings may be formed after the formation of the cover layers on the substrate, and the openings then with the solder paste while the substrate is held on a substrate support.

With this bump formation method, the provision of the squeegeeing helper means lessens the difference between the height position of the mask and the height position of the periphery of the substrate. Accordingly, the squeegee can be moved not only over the cover layer, but also over the squeegeeing helper means. In other words, not only the solder paste on the substrate, but also the solder paste on the squeegeeing helper means can be moved at the same time and used to fill in the openings. This means that the various openings can be filled with solder paste easily and reliably even when the bumps are being formed on a substrate with uneven width dimensions (such as a silicon wafer).

As shown in FIG. 18a, when bumps were formed on electrode pads 15a of a disk-shaped substrate 15 such as a silicon wafer, the following problems were encountered in the filling of the openings 16a in a mask 16 with a solder paste P. The filling of the openings 16a with the solder paste P was carried out by readying the solder paste P along a specific edge 16A of the mask 16 and moving a squeegee S to the edge 16B on the opposite side. Here, if we look at the movement path of the squeegee S, we see that, as shown in FIG. 18b, the size of the substrate 15 (mask 16) in the direction perpendicular to the movement direction of the squeegee S increases along with the movement of the squeegee S at first, but decreases after passing the widest portion. Therefore, if the solder paste P is readied near the starting point of the squeegee S, the solder paste P can only be moved in a width roughly corresponding to the length of the readied solder paste P. This makes it difficult to properly fill the openings 16a' formed along the edge of the above-mentioned widest portion with a sufficient amount of the solder paste P'. Also, if the openings 16a are formed right up to the edge of the mask 16, then when the squeegee S is moved up to the opposite edge 16B of the mask 16 in order to fill these openings 16a with the solder paste, the solder paste P will end up being scraped off the mask 16. Accordingly, this solder paste P cannot be moved back to the starting portion of the squeegee S by using the squeegee S, which is a problem in that the solder paste is not utilized effectively.

In contrast, with the above-mentioned solder bump formation method, the periphery of the substrate is surrounded by the squeegeeing helper means, so if the squeegeeing helper means is taken into account, the size in the direction perpendicular to the movement direction of the squeegee can be made larger than the widest section of the substrate, and the distance that the squeegee moves can also be made larger than the substrate.

Therefore, if solder paste is readied on the cover layer or on the squeegeeing helper means so as to correspond to, or be longer than, the widest section of the substrate, and this is moved by the squeegee, then even those openings formed at the widest section of the substrate, or in the vicinity thereof, can be properly filled with solder paste. Also, if the distance the squeegee moves during filling can be made larger, then the solder paste can be moved back on the squeegeeing helper means even when the squeegee has reached the edge of the substrate, so this solder paste can be reused.

For this effect to be achieved in the best way, it is preferable for the squeegeeing helper means and the cover layer to be in the same or approximately the same plane, but as long as the movement of the squeegee is not hindered, there may be some difference in the height of these.

The squeegeeing helper means is provided by forming a resin layer so as to surround the periphery of the substrate, or by disposing a plate or the like having an opening corresponding to the shape of the substrate so as to surround the periphery of the substrate. The squeegeeing helper means may have an opening through which all of the openings provided to the cover layer can be exposed, and as long as the movement of the squeegee is not hindered, the squeegeeing helper means may be provided so that it covers the cover layer, and the surface of the squeegeeing helper means is higher than the surface of the cover layer. Naturally, to the extent that the object of the present invention can still be achieved, the squeegeeing helper means does not necessarily have to be provided so as to surround the entire periphery of the substrate, and need only be provided to the required region of the substrate periphery. Also, the squeegeeing helper means does not necessarily have to be provided as a single integrated member or element, and a plurality of members or elements may be combined to make up the squeegeeing helper means.

However, the resin layer cannot be reused after it has been removed following bump formation, but a plate can be used over and over, so in this respect it is preferable to provide the squeegeeing helper means by disposing a plate. Also, if the squeegeeing helper means comprises a plate, any excess solder paste that did not fill the openings in the cover layer can be moved back on the squeegeeing helper means, and this solder paste that has been moved back to the squeegeeing helper means can be reused in the formation of bumps on the next substrate.

When the squeegeeing helper means is formed from a resin layer, it is preferable to form the resin layer from a material that dissolves in the same etchant as the cover layer, for example, in order to remove the resin layer at the same time in the removal of the cover layer.

Meanwhile, it is preferable for the substrate support to have a recess capable of accommodating at least part of the substrate. If it does, then movement of the substrate with respect to the substrate support can be restricted even when the squeegee is moved over the substrate in order to fill the openings with the solder paste. Since the substrate can be set in place on the substrate support just by placing the substrate in the recess, and does not need to be fixed to the substrate support with an adhesive or the like, this is advantageous in terms of both cost and work efficiency.

The bump formation method provided by the second aspect of the present invention is a method for forming bumps on a substrate provided with a plurality of electrode pads, comprising the steps of forming a first cover layer over the substrate, forming a second cover layer over the first cover layer, forming a plurality of openings corresponding to the plurality of electrode pads in the first cover layer and the second cover layer by exposing these to light and developing with an etchant, filling each of the openings with metal, and heating the metal to integrate it with the electrode pads, wherein the first cover layer is formed from a material that will be dissolved by the etchant used to develop the second cover layer, and the first cover layer is etched to form the plurality of openings simultaneously with the developing of the second cover layer.

With this bump formation method, at the same time that the first openings constituting the above-mentioned openings are formed in the second cover layer by the etching of the second cover layer, the second openings constituting the above-mentioned openings are also formed in the first cover layer using the second cover layer as a mask. Therefore, openings can be formed substantially in the second cover layer by etching without separately etching the cover layers in the formation of the openings.

In a preferred embodiment, the first cover layer is formed from a material containing a macromolecule that is water-soluble or readily dissolves in an alkaline aqueous solution.

With this bump formation method, the second cover layer dissolves at the same time if at least the first cover layer is dissolved by water or an aqueous solution such as an alkaline aqueous solution, or the second cover layer is separated from the substrate, so the entire mask can be removed.

The bump formation method provided by the third aspect of the present invention is a method for forming bumps on a substrate provided with a plurality of electrode pads divided into a plurality of groups, comprising the steps of forming a mask having a plurality of openings corresponding to the plurality of electrode pads such that the size is different for each group, filling the openings with solder paste, forming bumps from the solder paste by heat treatment, and removing the cover layer from the substrate.

With this bump formation method, the amount of solder paste filling the various openings is different for each group of electrode pads. Accordingly, it is possible for the bums formed on the electrode pads to be different sizes, and for the height of the bumps to be different for each group.

One way to make the height of the bumps different for each group is to divide the plurality of into a group of first electrode pad groups and a group of second electrode pads with a larger surface area, and make the volume of the first openings formed in a pattern corresponding to the first electrode pads smaller than the volume of the second openings corresponding to the second electrode pads.

The larger the amount of solder paste on the electrode pads, the larger the bumps will be formed, and if the thickness of the cover layer is uniform and the molten solder does not touch the inner walls of the openings, then the smaller is the surface area of the electrode pads, the taller the bumps will be. Accordingly, if the relationship between the openings and the electrode pads is as above, then bumps of different heights can be formed more reliably.

The cover layer is formed, for example, by coating with a molten resin, or laying down a resin film. Examples of the component that makes up this cover layer include polymethyl methacrylate, polyacrylate, or polymethyl isopropenyl ketone. These components may be used singly or in combinations of two or more types.

The bump formation method provided by the fourth aspect of the present invention is a method for forming bumps on a substrate provided with a plurality of first electrode pads and a plurality of second electrode pads, comprising the steps of forming a first cover layer in a state in which the plurality of first electrode pads are covered and the plurality of second electrode pads are exposed, forming a plurality of first openings in the first cover layer in a pattern corresponding to the plurality of first electrode pads, forming a second cover layer so as to cover the first cover layer and the plurality of second electrode pads, forming a plurality of second openings in the second cover layer in a pattern corresponding to the plurality of second electrode pads, and forming a plurality of third openings in a pattern corresponding to the plurality of first openings, filling the first openings, second openings, and third openings with solder paste, forming bumps from the solder paste by heat treatment, and removing the second cover layer.

With this bump formation method, the thickness of the mask is different in the region in which the first electrode pads are formed and in the region in which the second electrode pads are formed. Therefore, the height is different between the bumps formed on the first electrode pads and the bumps formed on the second electrode pads.

It is preferable for the surface area of the third openings to be made larger than that of the second openings in order to make the amounts of solder paste filling the insides of the second and third openings markedly different and to achieve a good difference in height between the bumps on the first electrode pads and those on the second electrode pads.

Also, the third openings may be formed with a larger open surface area than the first openings, and just the second cover layer may be selectively removed, with the first cover layer left on the substrate.

If this is done, the first cover layer remains after the bumps have been formed, so bumps in which a spherical portion, example, protrudes from the surface of the first cover layer are formed over the first electrode pads such that they are raised up to the remaining first cover layer. Meanwhile, spherical bumps, for example, are formed directly on the second electrode pads. Accordingly, a good difference in height can be obtained between the bumps over the first electrode pads and the bumps over the second electrode pads.

The first and second cover layers are formed, for example, by coating the substrate with a molten resin, or laying a resin film over the substrate.

The first cover layer can be made up of a highly insulating resin based on a resin such as epoxyacrylate, epoxy, and polyimide.

The second cover layer can be made up of a highly insulating resin based on a resin such as polymethyl methacrylate, polyacrylate, or polymethyl isopropenyl ketone.

The bump formation method provided by the fifth aspect of the present invention is a method for forming bumps on a substrate provided with a plurality of electrode pads, comprising the steps of holding the substrate on a substrate support, forming a cover layer so as to cover at least the substrate, forming a plurality of openings in the cover layer in a pattern corresponding to the plurality of electrode pads, providing squeegeeing helper means for lessening the difference between the height position of the cover layer on the substrate and the height position of the periphery of the substrate, readying a metal paste (including solder paste) or metal powder on the cover layer or the squeegeeing helper means, moving a squeegee to push the metal paste or metal powder down into the openings, heating, melting, and, solidifying the metal paste or metal powder to integrate it on the electrode pads, and taking away the squeegeeing helper means.

This bump formation method need only comprise the various steps listed above, and does not necessarily have to follow the above order. For instance, the openings may be formed after the formation of the cover layer on the substrate, and the openings then filled with the solder paste while the substrate is held on a substrate support.

With this bump formation method, the provision of the squeegeeing helper means lessens the difference between the height position of the mask and the height position of the periphery of the substrate. Accordingly, the metal powder or metal paste can be moved not only over the cover layer, but also by utilizing the squeegeeing helper means, allowing the individual openings to be reliably filled with metal powder, etc., even when the bumps are formed on a substrate whose width is not even.

For this effect to be achieved in the best way, it is preferable for the squeegeeing helper means and the cover layer to be in the same or approximately the same plane, but as long as the movement of the squeegee is not hindered, there may be some difference in the height of these.

The squeegeeing helper means is provided by forming a resin layer so as to surround the periphery of the substrate, or by disposing a plate or the like having an opening corresponding to the shape of the substrate so as to surround the periphery of the substrate. The squeegeeing helper means may have an opening through which all of the openings provided to the cover layer can be exposed, and as long as the movement of the squeegee is not hindered, the squeegeeing helper means may be provided so that it covers the cover layer, and the surface of the squeegeeing helper means is higher than the surface of the cover layer.

Meanwhile, it is preferable for the substrate support to have a recess capable of accommodating at least part of the substrate. If it does, then movement of the substrate with respect to the substrate support can be restricted, allowing the squeegee to move more smoothly.

In all of the first to fifth aspects of the present invention discussed above, it is preferable if there is further provided a step of applying flux to the bumps formed from heat treated solder paste, and performing a heat treatment again to adjust the shape of the bumps.

A flux containing Polypale and hexylene glycol is used, for example.

In all of the first to fifth aspects of the present invention discussed above, it is preferable if the open surface area of the openings is no more than 25 times the surface area of the corresponding electrode pads. If it is, the molten solder can be gathered more reliably on the electrode pads when the solder is melted, allowing the solder to be formed in good spherical shapes.

The sixth aspect of the present invention provides an electronic component, comprising a substrate, a plurality of first electrode pads and a plurality of second electrode pads formed on the same surface of this substrate, a plurality of first bumps formed in a pattern corresponding to the plurality of first electrode pads, and a plurality of second bumps formed in a pattern corresponding to the plurality of second electrode pads, wherein the surface area of each of the first electrode pads is smaller than the surface area of each of the second electrode pads, and the top of each of the first bumps is located higher than the top of each of the second bumps.

The seventh aspect of the present invention provides an electronic component, comprising a substrate, a plurality of first electrode pads and a plurality of second electrode pads formed on the same surface of this substrate, a cover layer formed in the region of the substrate where the plurality of first electrode pads are formed and having a plurality of openings corresponding to the plurality of first electrode pads, a plurality of first bumps provided in a pattern corresponding to the plurality of first electrode pads, with spherical portions protruding from the cover layer, and a plurality of second bumps provided in a pattern corresponding to the plurality of second electrode pads, with spherical portions formed directly on the corresponding second electrode pads, wherein the top of each of the first bumps is located higher than the top of each of the second bumps.

The cover layer can be made from a highly insulating resin based on an epoxyacrylate, epoxy, polyimide, or other such resin.

A preferred embodiment of the electronic components discussed in the above-mentioned sixth and seventh aspects of the present invention is an electronic component further comprising a mounting object, wherein this mounting object is placed on the substrate with the plurality of second bumps therebetween, and the top of each of the first bumps is located at a height of at least 1.2 times the height location of the top of the mounting object.

With this structure, an additional mounting object can be placed on the substrate via the first bumps in a state in which the original mounting object is interposed between the additional mounting object and the substrate, or the substrate can be mounted on another substrate via the first bumps. Employing this structure affords higher mounting efficiency in the mounting of an electronic component on the substrate, and allows for a more compact electronic component consisting of a plurality of semiconductor chips or the like.

An electronic component having two kinds of bumps of different size was described in the sixth and seventh aspects of the present invention, while a method for forming two kinds of bumps of different size as needed was described in the first through fourth aspects of the present invention. However, when three or more kinds of bump of different size are to be formed, the present invention can be applied whenever any two bumps are of different size, and is not necessarily limited to when two kinds of bump of different size are formed.

The eighth aspect of the present invention provides a solder paste containing a solder powder and a solvent, wherein the solvent contains a first solvent having a boiling point lower than the melting point of the solder powder, and a second solvent having a boiling point higher than the melting point of the solder powder.

This solder paste can be used favorably in the formation of second bumps. In a preferred embodiment, the same solder paste as that discussed in the eighth aspect of the present invention can also be used in the first aspect of the present invention. Therefore, when the solder paste of the eighth aspect of the present invention is used to form second bumps, the same effects will be realized as when the solder paste of the first aspect of the present invention was used.

Specifically, since the first solvent has already vaporized in the melting of the solder, less heat is robbed from the solder through heat of vaporization of the solvent after the solder begins to melt, the effect being an amelioration of the problem of unmelted solder powder being left behind. Because a specific amount of the second solvent remains even after the solder has melted, the fluidity of the rosin or other resin component is maintained, the activator is not carried away as the solvent is vaporized, and the activator is able to get into all parts of the solder, allowing it to act more effectively. As a result, it is possible to form solder bumps with a good spherical shape and no variance in size.

For this effect to be obtained in an even better way, it is preferable for the first solvent to have a melting point 5 to 50° C. lower than the melting point of the solder powder, and for the second solvent to have a melting point 5 to 50° C. higher than the melting point of the solder powder. For the same reason, it is preferable for the first solvent to be contained in the solder paste in an amount of 2 to 6 wt %, and the second solvent in an amount of 2 to 6 wt %.

The types of first and second solvent to be used will be determined by the type (melting point) of the solder powder being used, and in the eighth aspect of the present invention, it is again preferable to use those listed as examples for the first aspect of the present invention (see Table 1).

BRIEF DESCRIPTION OF THE DRAWINGS

FIGS. 1a to 1e are cross sections illustrating the steps of forming a mask in the bump formation method pertaining to a first embodiment of the present invention;

FIGS. 5a to 5d are cross sections illustrating the final bump formation steps;

FIGS. 6a to 6f are cross sections illustrating the bump formation method pertaining to a second embodiment of the present invention;

FIG. 7a is a cross section giving an enlarged detail view of FIG. 6a, and FIG. 7b is a cross section giving an enlarged detail view of FIG. 6b;

FIGS. 13a to 13h are cross sections illustrating the bump formation method pertaining to a third embodiment of the present invention;

DESCRIPTION OF THE PREFFERED EMBODIMENTS

Figure 2A:
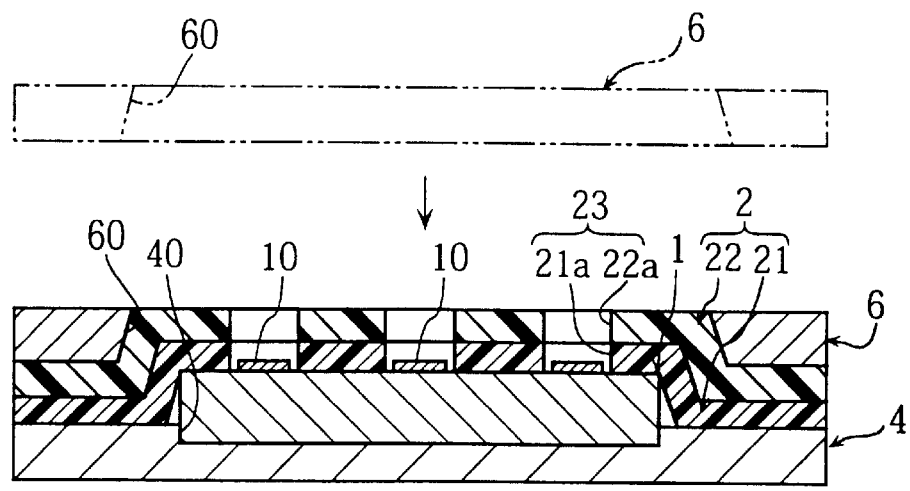
FIGS. 2a and 2b are a cross section and a plan view illustrating the step of providing the squeegeeing helper means around the substrate.

Preferred embodiments of the present invention will now be described in detail through reference to the drawings.

First, the bump formation method pertaining to the first embodiment of the present invention will be described in specific terms through reference to FIGS. 1 to 5. In this first embodiment we will describe the method for forming bumps on a circular substrate.

The bump formation method pertaining to the first embodiment is broadly divided into a step in which a mask is formed, a step in which a squeegeeing helper means is provided, a printing step, and a step in which the bumps are finally formed.

The step of forming a mask involves positioning a substrate 1 shown in FIG. 1a, forming a first cover layer 21 shown in FIG. 1b, forming a second cover layer 22 shown in FIG. 1c, and forming openings 23 shown in FIGS. 1d and 1e.

The positioning of the substrate 1 is performed by putting the substrate 1 inside a recess 40 in a substrate support 4 as shown in FIG. 1a. The recess 40 has an open surface area corresponding to the plan view surface area of the substrate 1, but its depth is less than the thickness of the substrate 1. Accordingly, only the lower part of the substrate 1 fits into and is positioned in the recess 40, which restricts the movement of the substrate 1.

When the substrate 1 is positioned in this way, there is no need to use an adhesive or the like to fix the substrate 1 to the substrate support 4, which makes the work easier. A plurality of electrode pads 10 are provided to the substrate 1.

The formation of the first cover layer 21 is performed by coating the substrate 1 with a solution of a polyacrylic acid, polyvinyl alcohol, or other such macromolecule with high water solubility by a know process such as spin coating or screen printing (see FIG. 1b). The thickness of the first cover layer 21 is set to about 0.01 to 10 $\mu$m, for example.

The formation of the second cover layer 22 is performed by subjecting a resin film containing a highly photopolymerizable or photodegradable (photosensitive) material to hot press bonding over the first cover layer 21 (see FIG. 1c). This resin film is a negative type in which the portion irradiated with light is polymerized, for example; specifically, it comprises a photopolymerization initiator mixed with an acrylic ester or methacrylic ester. The thickness of the second cover layer 22 is set according to the height of the bumps to be formed and the thickness of the first cover layer 21, but when the height of the bumps is 75 $\mu$m, for example, this thickness is about 20 to 60 $\mu$m.

The formation of the openings 23 is performed by forming second openings 22a corresponding to the second cover layer 22 and, at the same time, forming first openings 21a corresponding to the first cover layer 21, as shown in FIGS. 1d and 1e.

In the formation of the second openings 22a, when the second cover layer 22 is formed using a negative type resin, for example, first the portion corresponding to the electrode pads 10 is irradiated with light in a state in which a photomask 5 with an opaque component 50 is in place, as shown in FIG. 1d. Then, as shown in FIG. 1e, the photomask 5 is taken off, and the second openings 22a are formed by removing the portion not irradiated with light (non-polymerized component) using an etchant such as a tetramethylammonium hydroxide aqueous solution. Here, the second cover layer 22 in which the second openings 22a are formed functions as a mask for the first cover layer 21. If the first cover layer 21 is formed from a highly water-soluble macromolecular material, then the first cover layer 21 will also be selectively removed only in the portion corresponding to the electrode pads 10, forming the first openings 21a. The openings 23 (21a and 22a) are thus formed in the first and second cover layers 21 and 22, and a mask 2 is formed such that it covers the substrate 1 and leaves the electrode pads 10 exposed.

The open surface area of the openings 23 is preferably no more than 25 times the surface area of the electrode pads 10.

Figure 2B:
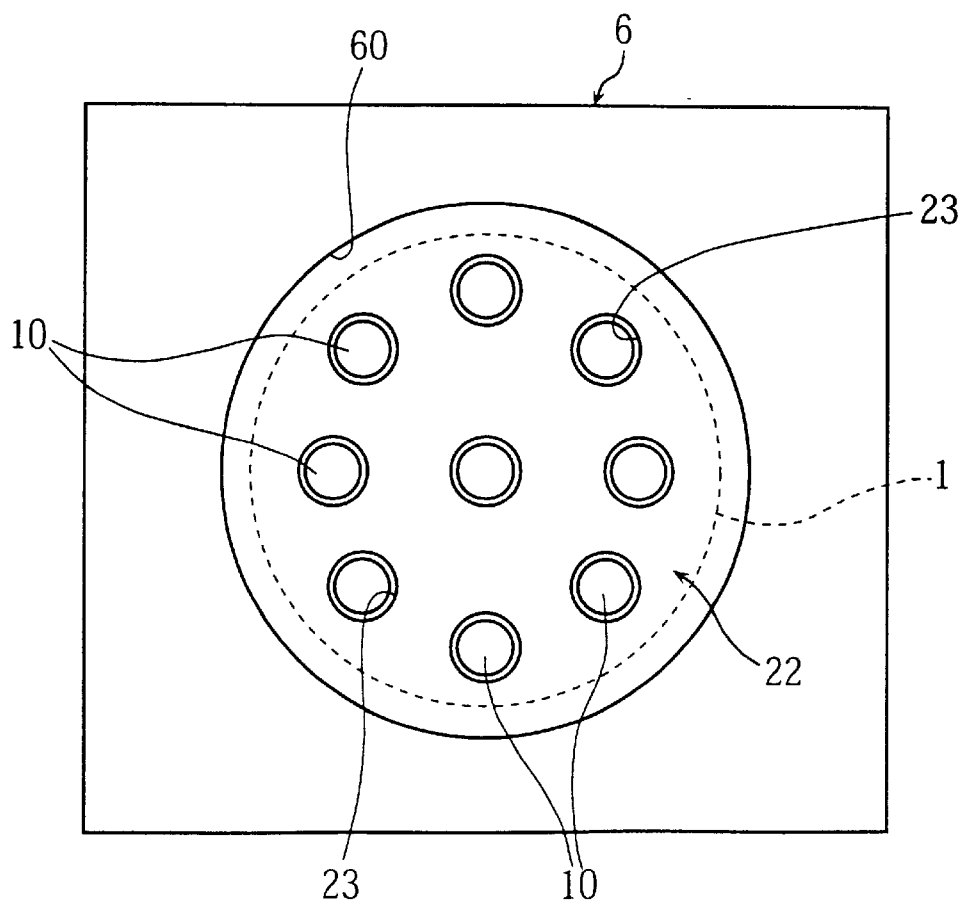

The step of forming the squeegeeing helper means is carried out by disposing a rectangular frame-shaped plate 6 with an opening 60 formed in its middle, such that it surrounds the substrate 1 as shown in FIGS. 2a and 2b. The plate 6 is entirely formed from a resin such as Teflon or a metal such as stainless steel. The opening 60 in the plate 6 has an open surface area substantially corresponding to the plan view surface area of the substrate 1, and the thickness of the plate 6 substantially corresponds to the difference between the height location of the second cover layer 22 on the substrate 1 and the height location of the second cover layer 22 around the substrate 1. Accordingly, with the plate 6 in place, the height location of the second cover layer 22 around the substrate 1 is the same or substantially the same as the height location of the second cover layer 22 on the substrate 1. As a result, the squeegee S, the solder paste P, etc., can be moved not only over the second cover layer 22 on the substrate 1, but also over the squeegeeing helper means 6 (see FIGS. 3 and 4).

Naturally, to the extent that movement of the squeegee S is not lost, there maybe a difference in the height locations of the squeegeeing helper means 6 and the second cover layer 22. In this case, the height location of the second cover layer 22 may be about 200 μm, for example, lower than the squeegeeing helper means 6.

The printing step is carried out by moving the solder paste P with the squeegee S as shown in FIGS. 3a, 3b, 4a, and 4b so as to fill the openings 23 with the solder paste P.

Figure 3A:
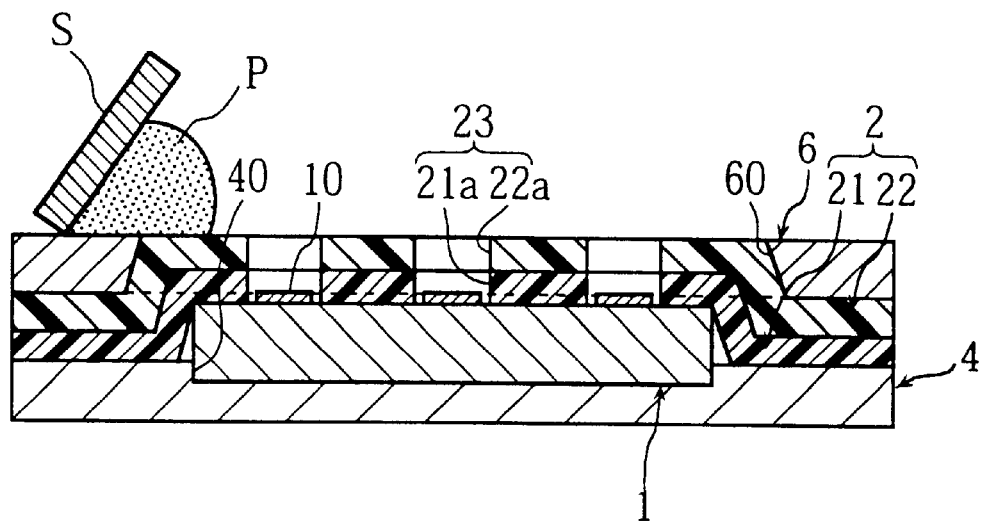
FIGS. 3a and 3b are a cross section and a plan view illustrating the printing step.
Figure 3B:
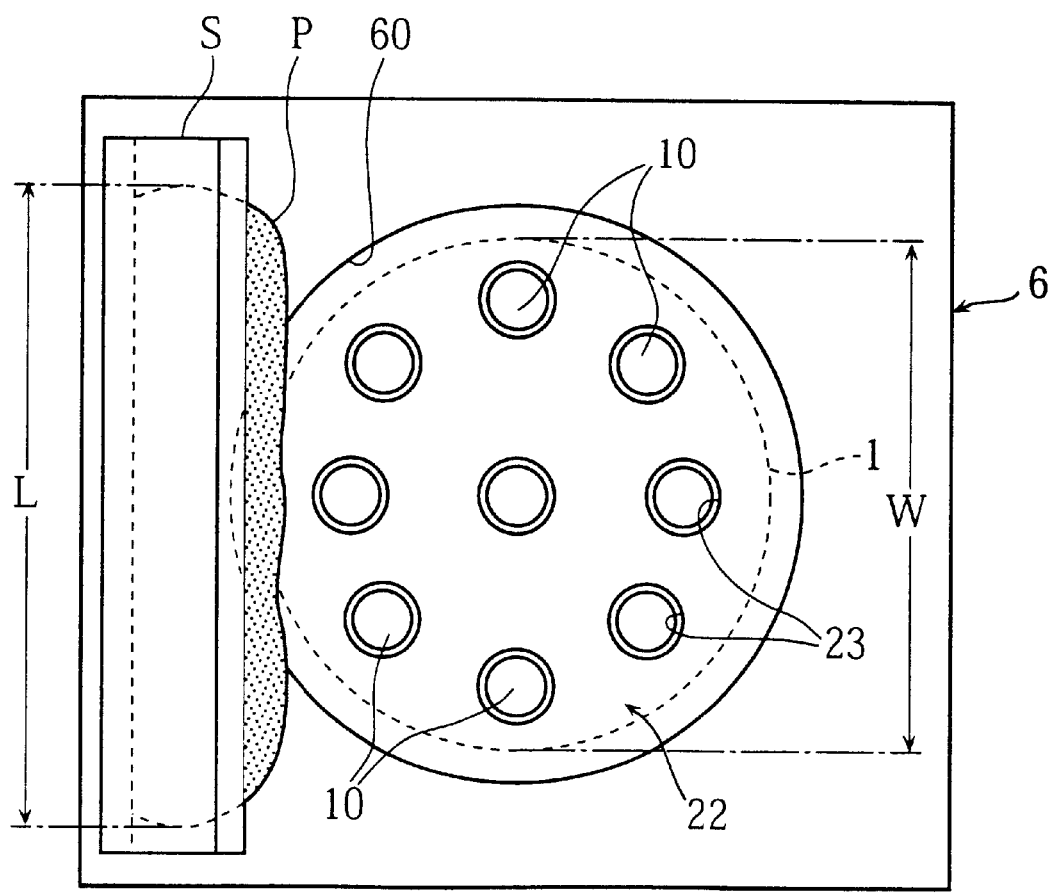

First, as shown in FIGS. 3a and 3b, solder paste P is readied on the second cover layer 22 and the squeegeeing helper means 6 around the edges of the squeegeeing helper means 6. Here, the length L of the region in which the solder paste P is readied is preferably longer than the maximum width W of the substrate 1. In this embodiment, the squeegeeing helper means 6 is provided so as to be the same or substantially the same height as the second cover layer 22, so the squeegeeing helper means 6 is also utilized to ready the solder paste P. Doing so allows the solder paste P to be readied so as to be longer than the maximum width W of the substrate 1 even when the width of the substrate 1 is not consistent. In this case, the squeegee S is longer than the maximum width W of the substrate 1.

The solder paste P used in this printing step is one that contains solder powder and a flux vehicle, and preferably has a viscosity of 100 to 400 Pa·s.

Tin, lead, bismuth, zinc, copper, cadmium, antimony, and other such components can be used for the solder, with typical examples including 63%Sn-Pb, Sn-3.5%Ag, and 5%Sn-Pb.

The solder powder that is used contains no more than 10 wt % particles whose diameter is greater than the thickness of the mask 2 and no more than 1.5 times this thickness, for example. Preferably, the solder powder contains no more than 10 wt % particles with a diameter of 40% or more of the open diameter of the openings 23, and even more preferably, contains at least 30 wt % particles whose diameter is 40 to 100% of the thickness of the mask 2.

The flux vehicle contains rosin, an activator, and a solvent, and preferably the combined content of halogen elements and alkali metal elements is no more than 100 ppm.

The rosin can be polymerized rosin, hydrogenated rosin, esterified rosin, or the like. The amount in which the rosin is contained in the solder paste P is 2 to 6 wt %, for example.

The activator can be sebacic acid, succinic acid, adipic acid, glutaric acid, triethanolamine, monoethanolamine, or another organic acid or organic amine. The amount in which the activator is used in the solder paste P is 0.01 to 2 wt %, for example.

It is preferable for the solvent to include a first solvent having a boiling point lower than the melting point of the solder powder, and a second solvent having a boiling point higher than the melting point of the solder powder. Even more preferably, the first solvent has a boiling point 5 to 50° C. lower than the melting point of the solder powder, and the second solvent has a boiling point 5 to 50° C. higher than the melting point of the solder powder. The amounts in which the first and second solvents are contained in the solder paste P are each about 2 to 6 wt %.

Figure 4A:
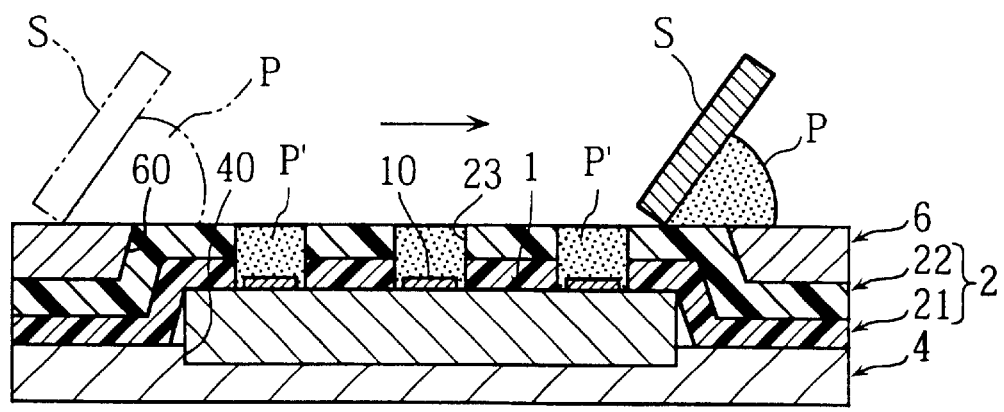
FIGS. 4a and 4b are a cross section and a plan view illustrating the printing step.
Figure 4B:
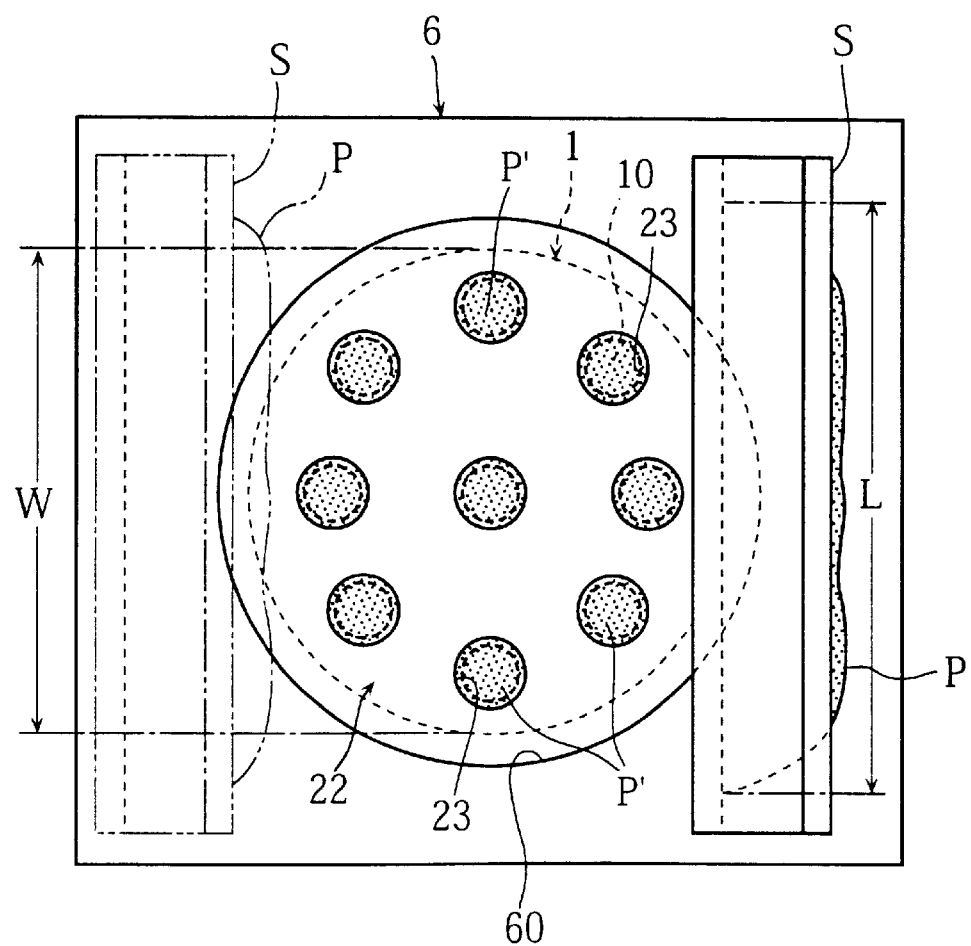

Next, as shown in FIGS. 4a and 4b, the squeegee S is positioned so that it covers the solder paste P, and this squeegee S is moved so that it touches the tops of the squeegeeing helper means 6 and the second cover layer 22. In this process, because the length of the squeegee S and the length L of the region in which the solder paste P is readied are greater than the maximum width W of the substrate 1, the squeegee S and the solder paste P move over all of the openings 23, and the solder paste P' drops into all of the openings 23. The squeegee S may also be moved opposite to its previous movement path in an effort to improve the filling of the openings 23 with the solder paste P.

The solder paste P used in this embodiment has a small proportion of solder powder particles with relatively large diameter as compared to the thickness of the mask 2. Consequently, even if the squeegee S is moved back and forth over the mask 2, there is little danger that the solder powder that has filled the openings 23 will be scraped back out again by the squeegee S.

The step of finally forming the bumps is carried out by first taking away the squeegee S and the squeegeeing helper means 6 as shown in FIG. 5a, then heat treating the solder paste and removing the mask 2.

In taking away the squeegeeing helper means 6, if the excess solder paste P that has not filled the openings 23 on the squeegeeing helper means 6 is moved back first, then this excess solder paste P can be removed simultaneously with the squeegeeing helper means 6. Furthermore, when the squeegeeing helper means 6 onto which the solder paste P has been moved is used in the printing of the solder paste P onto the next substrate 1, this solder paste P can be reused.

The heat treatment of the solder paste P is carried out, for example, by sending the printed substrate 1 into a heating furnace after the squeegee S and the squeegeeing helper means 6 have been removed. The temperature in the heating furnace is determined by the type of solder paste being used (and particularly the solder components), but is roughly 250 to 450° C. This heat treatment melts the solder paste p', but the molten solder forms a ball due to its surface tension. When this molten solder is cooled and solidified, spherical bumps B are integrated with the electrode pads 10 as shown in FIG. 5b.

In this embodiment the solder paste P is one that contains a first solvent having a boiling point lower than the melting point of the solder powder, and a second solvent having a boiling point higher than the melting point of the solder powder. Accordingly, since the first solvent has already vaporized in the melting of the solder, less heat is robbed from the solder through heat of vaporization of the solvent after the solder begins to melt, the effect being an amelioration of the problem of unmelted solder powder being left behind. Because a specific amount of the second solvent remains even after the solder has melted, the fluidity of the rosin or other resin component is maintained, the activator is not carried away as the solvent is vaporized, and the activator is able to get into all parts of the solder, allowing it to act more effectively. As a result, it is possible to form solder bumps with a good spherical shape and no variance in size. Also, as discussed above, the solder powder that has already filled the openings 23 is not scraped away by repeated squeegeeing, so the amount of solder paste P' filling the openings 23 remains constant, and this also contributes to less variance in the size of the bumps.

As shown in FIGS. 5c and 5d, the removal of the mask 2 is carried out by dissolving away the first cover layer 21 with a treatment liquid such as water or an aqueous solution, and then peeling the second cover layer 22 from the substrate 1. In other words, if the second cover layer 22 is formed from a material that does not dissolve in water, just the first cover layer 21 will be selectively removed as shown in FIG. 5c. This eliminates the adhesion between the second cover layer 22 and the substrate 1, and allows the second cover layer $22^7$ to be removed as shown in FIG. 5d.

Naturally, if the first cover layer $21^6$ is dissolved by an aqueous solution that is also capable of dissolving the second cover layer $22^7$, this water-soluble second cover layer $22^7$ will also be dissolved by the aqueous solution, and the first and second cover layers 21 and 22 can be dissolved away at the same time.

After the mask 2 is removed from the substrate 1, the substrate 1 is separated from the substrate support 4 as shown in FIG. 5d. Since the substrate 1 is merely resting in the recess 40 of the substrate support 4, it can be easily taken out of the substrate support 4.

With this embodiment, the mask 2 was provided by forming the cover layers 21 and 22 from resin or the like, but a metal mask in which openings corresponding to the electrode pads have already been made my be used as the mask, and this mask placed over the substrate. Again when a mask such as this is used, the solder paste P used in this embodiment has a small proportion of solder powder particles with relatively large diameter as compared to the thickness of the mask, so when the metal mask is removed after the openings have been filled with the solder paste, there is little danger that the solder paste clinging to the inner walls of the openings will taken away along with the metal mask. Accordingly, variance in the size of the bumps is less likely to occur in a bump formation method that makes use of a metal mask.

Next, the bump formation method pertaining to the second embodiment of the present invention will be described through reference to FIGS. 6 and 7. FIGS. 6a to 6f illustrate the bump formation method pertaining to the second embodiment of the present invention, while FIGS. 7a and 7b are enlarged detail views of FIGS. 6a and 6b, respectively. In this embodiment, solder bumps are formed all at once in a plurality of regions that will subsequently become individual electronic elements, in the form of a wafer (substrate) on which electrode pads and wiring have been formed.

The object of the bump formation method in this embodiment is to divide the electrode pads 10a and 10b into a plurality of groups as shown in FIG. 6a, and form bumps Ba and Bb of different heights in each group as shown in FIG. 6f. Accordingly, the size of the openings 23a and 23b formed in the mask 2 is different for each group, but the basic steps are the same as in the bump formation method pertaining to the first embodiment of the present invention. This is described in specific terms below.

As shown in FIG. 6a, a plurality of first electrode pads 10a and a plurality of second electrode pads 10b are formed on the substrate 1. As shown in FIG. 7a, these electrode pads 10a and 10b are formed by forming an insulating film 11 on the substrate 1 so as to expose the areas that will become terminals for wiring (not shown) formed in a pattern, and then performing metal plating or the like so as to cover the exposed areas and their peripheral components. Accordingly, the electrode pads 10a and 10b are shaped such that their center portions are lower than their peripheral components. It is preferable for the first electrode pads 10a to be formed in a smaller surface area than the second electrode pads 10b so that their will be a good difference in the heights of the bumps Ba and Bb.

As shown in FIG. 6b, a cover layer 2A is formed on the substrate 1 from a photosensitive and insulating resin material so as to cover the electrode pads 10a and 10b, for instance. The cover layer 2A is formed, for example, by forming the above-mentioned resin material as a film, and subjecting this to hot press bonding over the substrate 1. The cover layer 2A formed in this manner conforms closely to the insulating film 11, as shown in FIG. 7b. In contrast, because the electrode pads 10a and 10b are recessed, the cover layer 2A does not conform to the centers of the electrode pads 10a and 10b, and some space is left in between.

Examples of the resin material that makes up the cover layer 2A include polymethyl methacrylate, polyacrylate, and polymethyl isopropenyl ketone.

Next, just as with the first embodiment of the present invention, exposure and developing treatments are performed on the areas corresponding to the electrode pads 10a and 10b in the cover layer 2A. As shown in FIG. 6c, this forms openings 23a and 23b corresponding to the electrode pads 10a and 10b in the cover layer 2A, and provides the mask 2 over the substrate 1. Here, by forming windows of a specific surface area in the photomask used for the exposure treatment, first openings 23a of relatively large open surface area and volume are formed in those areas corresponding to the first electrode pads 10a, while second openings 23b of relatively small open surface area and volume are formed in those areas corresponding to the second electrode pads 10b.

The developing treatment is carried out, for example, by using etching to remove the areas in the cover layer 2A where the openings 23a and 23b are to be formed. If the cover layer 2A is floating above the centers of the electrode pads 10a and 10b, the cover layer 2A will be suitably removed, and as a result the cover layer 2A will not remain behind in the centers of the electrode pads 10a and 10b after the openings 23a and 23b have been formed.

After the first and second openings 23a and 23b have been formed, they are filled with solder paste Pa and Pb as shown in FIG. 6d. This filling with solder paste Pa and Pb is accomplished by the same printing step as described for the first embodiment of the present invention, for example. Naturally, the solder paste Pa and Pb can be the same as what was used in the first embodiment of the present invention.

Next, the solder paste Pa and Pb filling the openings 23a and 23b, respectively, is heated and melted by a heat treatment. This eliminates through volatilization any components such as solvent other than the solder component contained in the solder paste Pa and Pb, and the solder component is gathered together into an approximate spherical shape through surface tension as shown in FIG. 6e. The solder solidifies in this shape in the subsequent cooling process, forming a plurality of solder bumps Ba and Bb affixed to the electrode pads 10a and 10b. Here, the first bumps Ba which are relatively taller and larger in volume are formed in the first openings 23a which have a relatively large volume, while the second bumps Bb which are relatively shorter and smaller in volume are formed in the openings second openings 23b which have a relatively small volume.

After this, as shown in FIG. 6f, the mask 2 is removed from the substrate 1 by peeling the mask 2 from the substrate 1 or dissolving the mask 2 with a suitable solvent.

Figure 8:
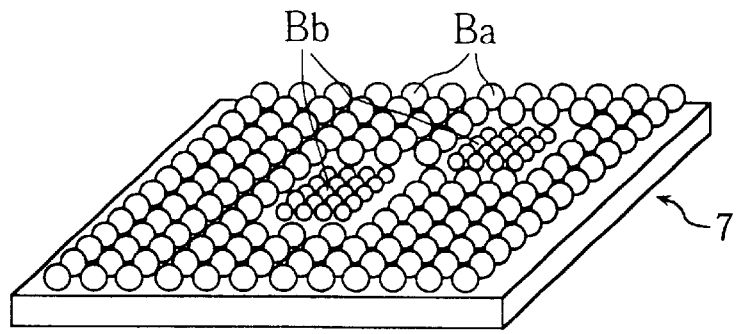
FIG. 8 is a perspective view showing an example of an electronic element obtained through the bump formation method pertaining to the second embodiment of the present invention.

The substrate (wafer) 1 on which the first bumps Ba and second bumps Bb of different heights have been formed is divided up into individual electronic element formation regions using a diamond cutter or the like, which provides, for example, an electronic element 7 provided in its center with two regions where the shorter second bumps Bb are gathered, and in which the taller first bumps Ba are formed in the other regions, as shown in FIG. 8.

Figure 9:
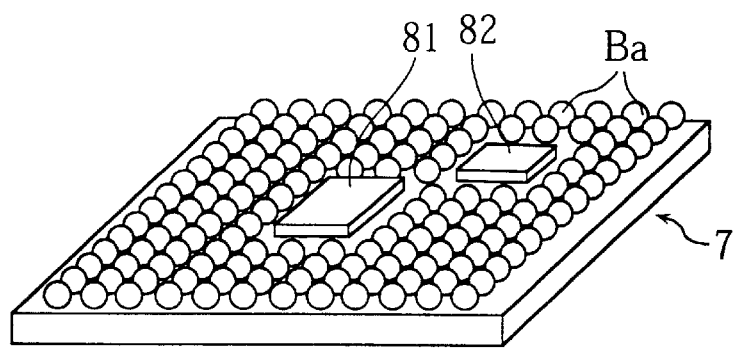
FIG. 9 is a perspective view showing the state in which sub-chips are mounted on an electronic element (main chip) in FIG. 8.
Figure 10A:
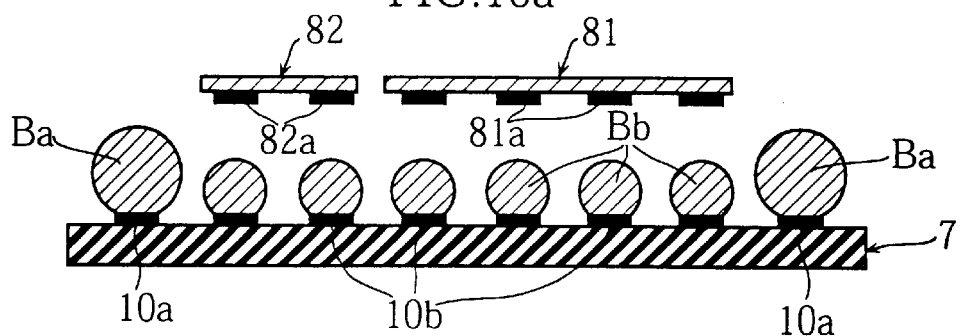
FIGS. 10a and 10b are perspective views illustrating the steps of mounting the sub-chips on the electronic element (main chip) in FIG. 8.

As shown in FIG. 9, for instance, other electronic elements (sub-chips) 81 and 82 are mounted on the electronic element (main chip) 7 shown in FIG. 8. These sub-chips 81 and 82 each have a surface area corresponding to a region where the second bumps Bb are gathered, as shown in FIG. 10a, and their surfaces are provided with electrode pads 81a and 82a that correspond to the second bumps Bb of the main chip 7 and that are electrically connected to wiring (not shown). A memory LSI, analog element, or the like is used for each of the sub-chips 81 and 82.

Figure 10B:
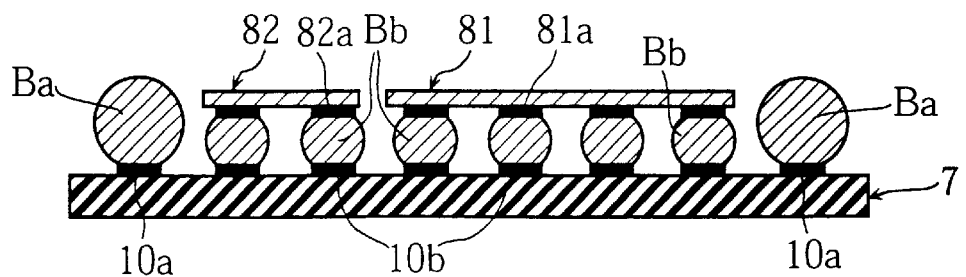

As shown in FIG. 10b, the mounting of the sub-chips 81 and 82 is carried out by positioning the electrode pads 81a and 82a of the sub-chips 81 and 82 so that they are facing and in contact with the second bumps Bb of the main chip, then heating and melting the shorter bumps 18, and finally cooling.

Figure 11:
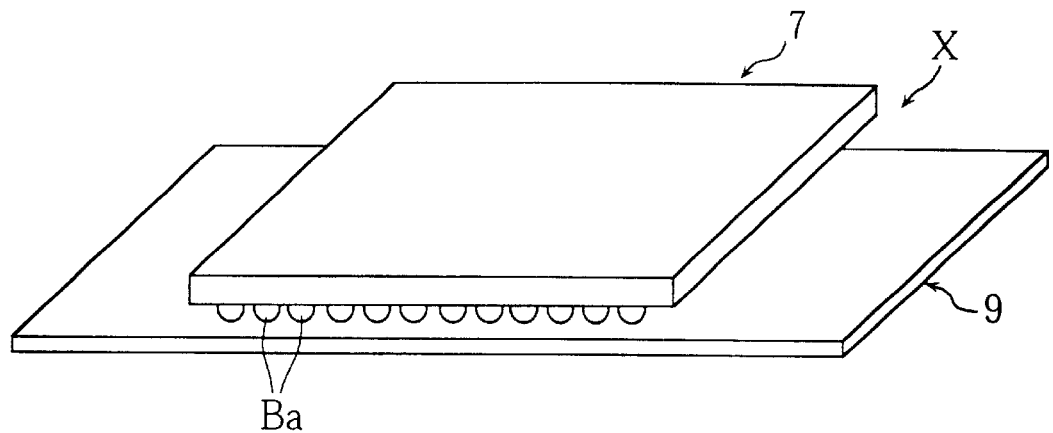
FIG. 11 is a perspective view showing the state in which the main chip in the state in FIG. 9 is mounted on a rewired substrate.
Figure 12A:
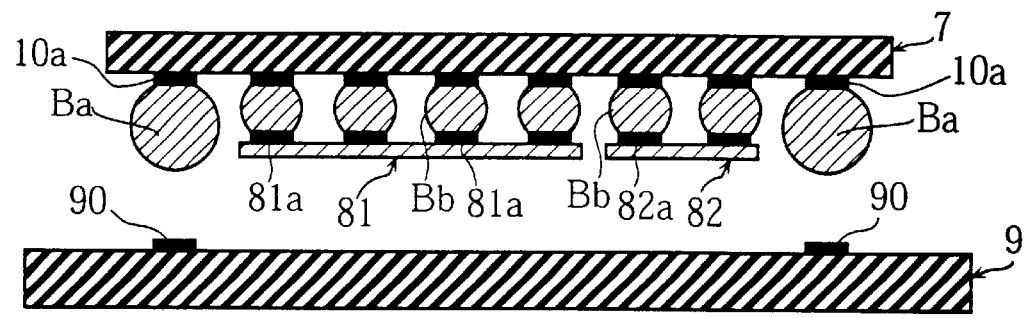
FIGS. 12a and 12b are cross sections showing the state in which the main chip is mounted on a rewired substrate.

The main chip 7 on which the sub-chips 81 and 82 are mounted is itself mounted on a rewiring substrate 9 as shown in FIG. 11, for example. The rewiring substrate 9 is provided with a plurality of electrode pads 90 corresponding to the first bumps Ba of the main chip 7 and is electrically connected to wiring (not shown). In this mounting of the main chip 7 to the rewiring substrate 9, as shown in FIG. 12a, first, the main chip 7 is turned over and the first bumps Ba of the main chip 7 are positioned with respect to the electrode pads 90 of the rewiring substrate 9.

Figure 12B:
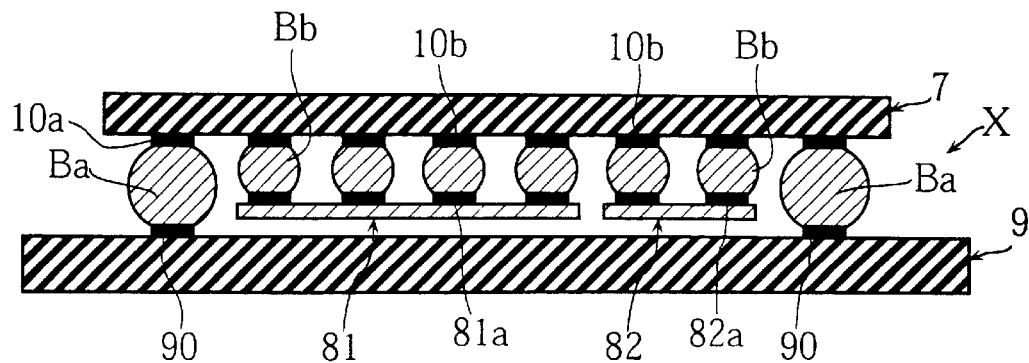

Then, as shown in FIG. 12b, the first bumps Ba of the main chip 7 are brought into opposition and contact with the various electrode pads 90 of the rewiring substrate 9, the first bumps Ba are heated, melted, and cooled in this state, and the main chip 7 is fixed to the rewiring substrate 9, thereby forming a multi-chip package X.

Here, the sub-chips 81 and 82 are held between the main chip 7 and the rewiring substrate 9. To attain this state as desired, if we take into account the deformation of the first bumps Ba when the main chip 7 is mounted on the rewiring substrate 9, it is preferable for the distance from the first electrode pads 10a of the main chip 7 to the top of the first bumps Ba to be at least 1.2 times the distance from the first electrode pads 10a to the outer surface of the sub-chips 81 and 82.

Next, the bump formation method pertaining to the third embodiment of the present invention will be described through reference to FIG. 13. In this embodiment, solder bumps are formed all at once in a plurality of regions that will subsequently become individual electronic elements, in the form of a wafer (substrate) on which electrode pads and wiring have been formed.

The object of the bump formation method in this embodiment is to divide the electrode pads 10a' and 10b' into a plurality of groups as shown in FIG. 13a, and form bumps Ba' and Bb' of different heights in each group as shown in FIG. 13h. Accordingly, the method for forming the mask 2 is different from that in the bump formation methods pertaining to the first and second embodiments of the present invention, but the basic steps are the same as in the bump formation methods pertaining to the first and second embodiments of the present invention. This is described in specific terms below.

As shown in FIG. 13a, a plurality of first electrode pads 10a' and a plurality of second electrode pads 10b' are formed on the substrate 1'. As shown in FIG. 13b, an insulating first cover layer 21' is formed on this substrate 1' so as to cover the electrode pads 10a' and 10b'. The first cover layer 21' is formed, for example, by performing hot press bonding on a film formed from an insulating resin material. Examples of the resin that makes up the first cover layer 21' include epoxyacrylate, epoxy, and polyimide.

Next, as shown in FIG. 13c, first openings 21a' are formed in the first cover layer 21' at positions corresponding to the first electrode pads 10a' by a known technique, such as photolithography. The first openings 21a' are formed so that their open surface area is smaller than the surface area of the first electrode pads 10a'. Simultaneously with the formation of the first openings 21a', the portions of the first cover layer 21' corresponding to the regions where the second electrode pads 10b' were formed are removed to expose the second electrode pads 10b'.

Then, as shown in FIG. 13d, a second cover layer 22' is formed so as to cover the first cover layer 21' and the second electrode pads 10b'. The second cover layer 22' can be formed from the same resin material as the cover layer 2A formed in the second embodiment (see FIG. 6b).

Next, as shown in FIG. 13e, a plurality of second and third openings 22a' and 22b' are formed in the second cover layer 22' by the same method as in the second embodiment, such as photolithography. The second openings 22b' are formed at positions corresponding to the second electrode pads 10b', and have relatively small open surface area and volume. The third openings 22a' are formed at positions corresponding to the first electrode pads 10a', are electrically connected to the first openings 21a', and have a relatively larger open surface area and volume than the first and second openings 21a' and 22b'.

A mask 2' is formed by thus forming the first cover layer 21' and the second cover layer 22', and forming the first to third openings 21a', 22a', and 22b'.

Then, as shown in FIG. 13f, the first to third openings 21a', 22a', and 22b' are filled with solder paste Pa' and Pb'. The method described for the first embodiment of the present invention can be employed for filling with the solder paste Pa' and Pb'.

Next, the solder paste Pa' and Pb' filling the openings 21a', 22a', and 22b' is melted by heat treatment. This eliminates through volatilization any components such as solvent other than the solder component contained in the solder paste Pa' and Pb'. As shown in FIG. 13g, the solder paste Pa' filling the first openings 21a' is melted while inside these openings. The solder component in the solder paste Pa' that fills each of the third openings 22a' is gathered together in a substantially spherical shape by its surface tension. In the subsequent cooling process, this shape is maintained as the solder is affixed on the first electrode pads 10a' via the solder paste Pa' filling the first openings 21a', resulting in the first bumps Ba'. The solder powder in the solder paste Pb' filling each of the second openings 22b' is also gathered together in a substantially spherical shape by its surface tension, and in the subsequent cooling process, this shape is maintained as the solder is affixed on the second electrode pads 10b', resulting in the second bumps Bb'.

Finally, as shown in FIG. 13h, the bumps Ba' and Bb' are formed on the electrode pads 10a' and 10b' of the substrate 1' by removing the second cover layer 22' from the substrate 1'. Here, the first cover layer 21' is left behind without being removed, and the first bumps Ba' are formed such that they are raised up to the first cover layer 21'. The spherical portions of the first bumps Ba' are larger than the second bumps Bb' because the third openings 22a' are larger in volume than the second openings 22b'. As a result, the first bumps Ba' are larger than the second bumps Bb' in terms of the distance from the electrode pads 10a' and 10b' to their tops.

Just as in the second embodiment, the substrate (wafer) 1' on which the first bumps Ba' and second bumps Bb' of different heights have been formed is divided up into individual electronic element formation regions using a diamond cutter or the like. In this electronic element 7', just as with the electronic element 7 in the second embodiment shown in FIG. 8, the shorter second bumps Bb' are gathered together in the center and the taller first bumps Ba' are formed in the other regions, as is clearly shown in FIG. 13h.

This electronic element (main chip) 7' can be used in a multi-chip package X' with increased density, just as in the second embodiment of the present invention.

Figure 14A:
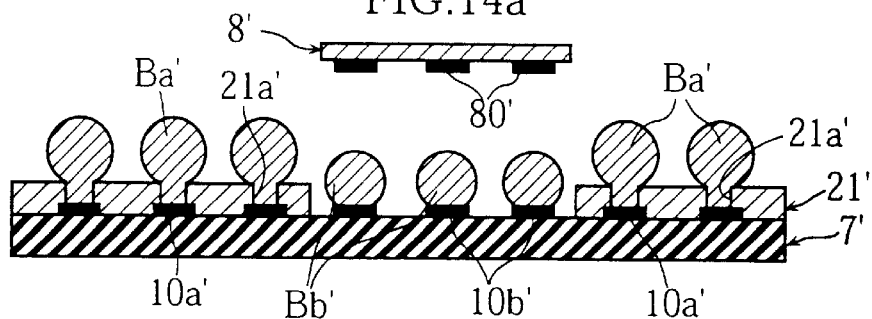
FIGS. 14a to 14d are cross sections showing the state in which a sub-chip is mounted on the electronic element (main chip) in FIG. 13, and this assembly is mounted on a rewired substrate.
Figure 14B:
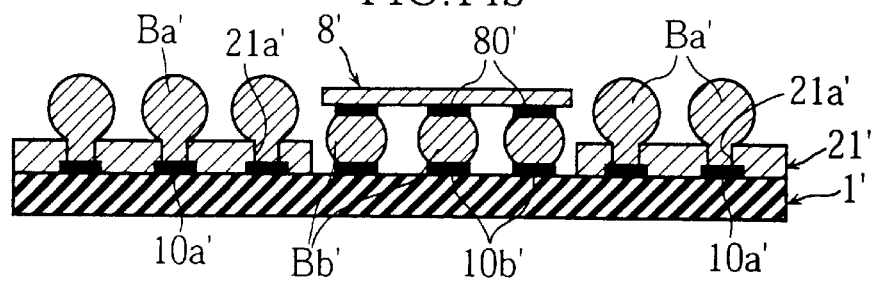

In this case, first, as shown in FIGS. 14a and 14b, another electronic element (sub-chip) 8' is mounted on the electronic element (main chip) 7'. A memory LSI, analog element, or the like is used for this sub-chip 8'. The mounting of the sub-chip' is carried out by positioning the electrode pads 80' provided to the sub-chip 8' so that they are facing and in contact with the second bumps Bb' of the main chip 7', then heating and melting the second bumps Bb' in this state, and finally cooling.

Figure 14C:
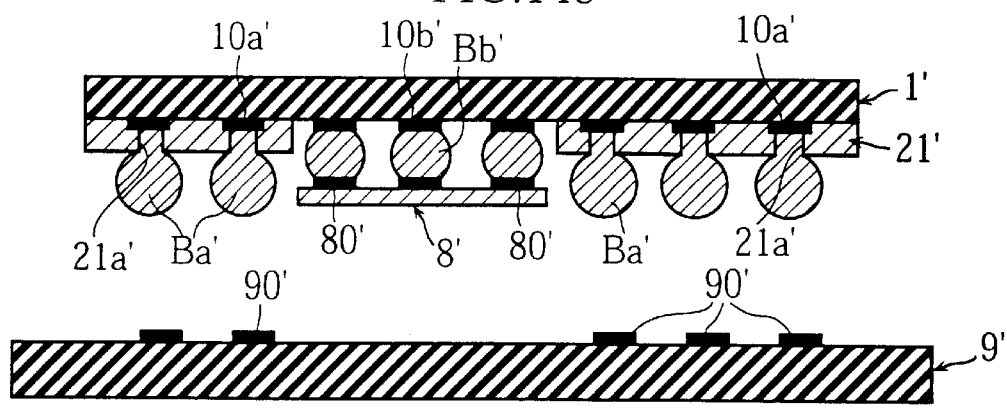
Figure 14D:
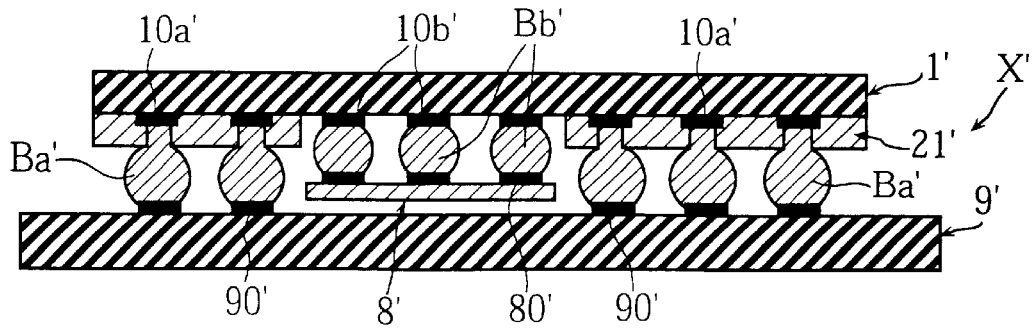

The main chip 7' on which the sub-chip 8' is mounted is itself mounted on a rewiring substrate 9' as shown in FIGS. 14c and 14d, for example. In this mounting of the main chip 7' to the rewiring substrate 9', as shown in FIG. 14c, first, the main chip 7' is turned over and the first bumps Ba' of the main chip 7' are positioned with respect to the electrode pads 90' of the rewiring substrate 9'. Then, as shown in FIG. 14d, the first bumps Ba' of the main chip 7' are brought into opposition and contact with the various electrode pads 90' of the rewiring substrate 9', the first bumps Ba' are heated, melted, and cooled in this state, and the main chip 7' is fixed to the rewiring substrate 9', thereby forming a multi-chip package X'.

Here, the sub-chip 8' is held between the main chip 7' and the rewiring substrate 9'. To attain this state as desired, if we take into account the deformation of the first bumps Ba' when the main chip 7' is mounted on the rewiring substrate 9', it is preferable for the distance from the first electrode pads 10a' of the main chip 7' to the top of the first bumps Ba' to be at least 1.2 times the distance from the first electrode pads 10a' to the outer surface of the sub-chip 8'.

Next, a semiconductor chip (electronic component) 7" of a fourth embodiment of the present invention, and a multi-chip package X" that makes use of this chip, will be described through reference to FIGS. 15 to 17.

Figure 15:
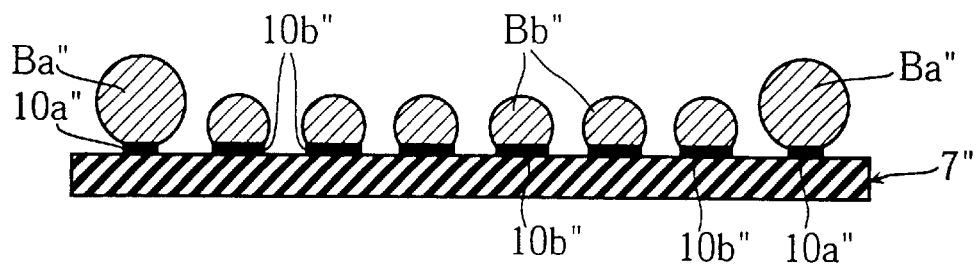
FIG. 15 is a cross section of the semiconductor chip in a fourth embodiment pertaining to the present invention.

As shown in FIG. 15, first electrode pads 10a" which have a relatively small surface area, second electrode pads 10b" which have a relatively large surface area, and a wiring component (not shown) which is electrically connected to these are formed on the surface of the chip substrate of a semiconductor chip 7". Relatively large first bumps Ba" and relatively small second bumps Bb" are junction-formed on the first and second electrode pads 10a" and 10b", respectively.

The semiconductor chip 7" can be obtained through the same steps as in the bump formation method pertaining to the second embodiment, with the only structural difference between a difference in the surface area of the first electrode pads 10a" and the second electrode pads 10b'.

With the bump formation method pertaining to the second embodiment, a larger amount of solder paste was placed on the first electrode pads 10a" than on the second electrode pads 10b" (see FIG. 6d). Accordingly, this bump formation method is employed to form relatively tall first bumps Ba" on the first electrode pads 10a" and relatively short second bumps Bb" on the second electrode pads 10b".

Because the surface area of the first electrode pads 10a" is relatively small, the junction surface area of the first bumps Ba" and the first electrode pads 10a" is relatively small, so the shape of the first bumps Ba" is close to spherical. On the other hand, since the surface area of the second electrode pads 10b" is relatively large, the junction surface area of the second bumps Bb" and the second electrode pads 10b" is relatively large, so the second bumps Bb" have a shape in which a relatively large part of the sphere is missing. This means that when a given amount of solder paste is placed on an electrode pad, a taller bump can be formed when the surface area of the electrode pad is smaller. Therefore, a significant difference in the heights of the first and second bumps Ba" and Bb" can also be ensured by providing a difference in the surface areas of the electrode pads 10a" and 10b", as with the semiconductor chip 7" of this embodiment.

Figure 16:
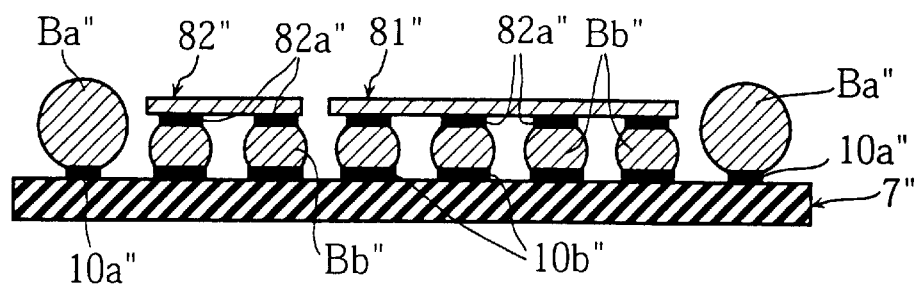
FIG. 16 is a cross section showing the state in which sub-chips are mounted on the semiconductor chip in FIG. 15.

FIG. 16 is a cross section in which sub-chips 81" and 82" are placed on the semiconductor chip 7" shown in FIG. 15. The sub-chips 81" and 82" are each a memory IC or analog element, for example, and have a structure in which electrode pads 81a" and 82a" corresponding to the second bumps Bb" of the semiconductor chip 7", and a wiring component (not shown) electrically connected thereto, are formed. The electrode pads 81a" and 82a" of the sub-chips 81" and 82" are electrically connected to the second electrode pads 10b" of the semiconductor chip 7" through the second bumps Bb". If we take into account the deformation of the first bumps Ba" when the semiconductor chip 7" is placed on another mounting object, it is preferable for the distance from the first electrode pads 10a" to the top of the first bumps Ba" to be at least 1.2 times the distance from the second electrode pads 10b" to the outer surface of the sub-chips 81" and 82".

Figure 17:
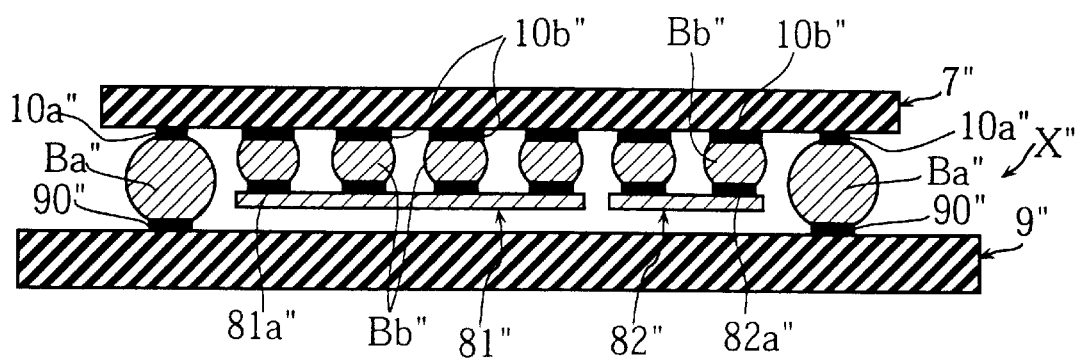
FIG. 17 is a cross section showing the state in which a semiconductor chip in the state in FIG. 16 is placed on a rewired substrate.
Figure 18A:
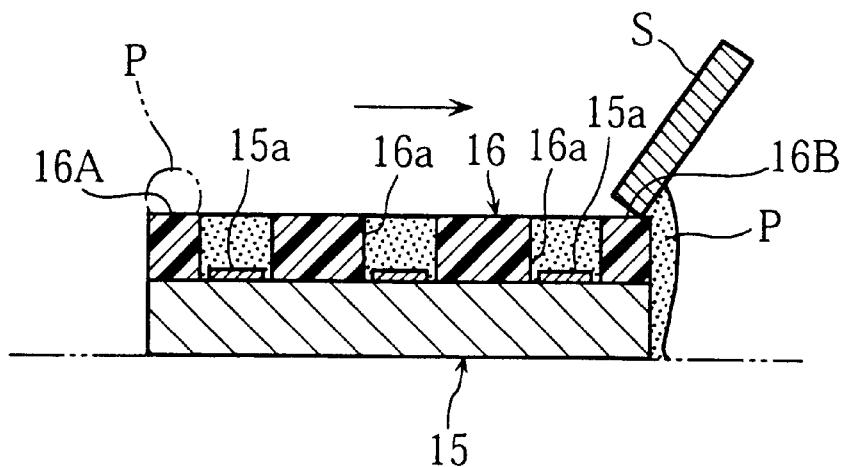
FIGS. 18a and 18b are a cross section and a plan view illustrating the printing step in a conventional bump formation method.
Figure 18B:
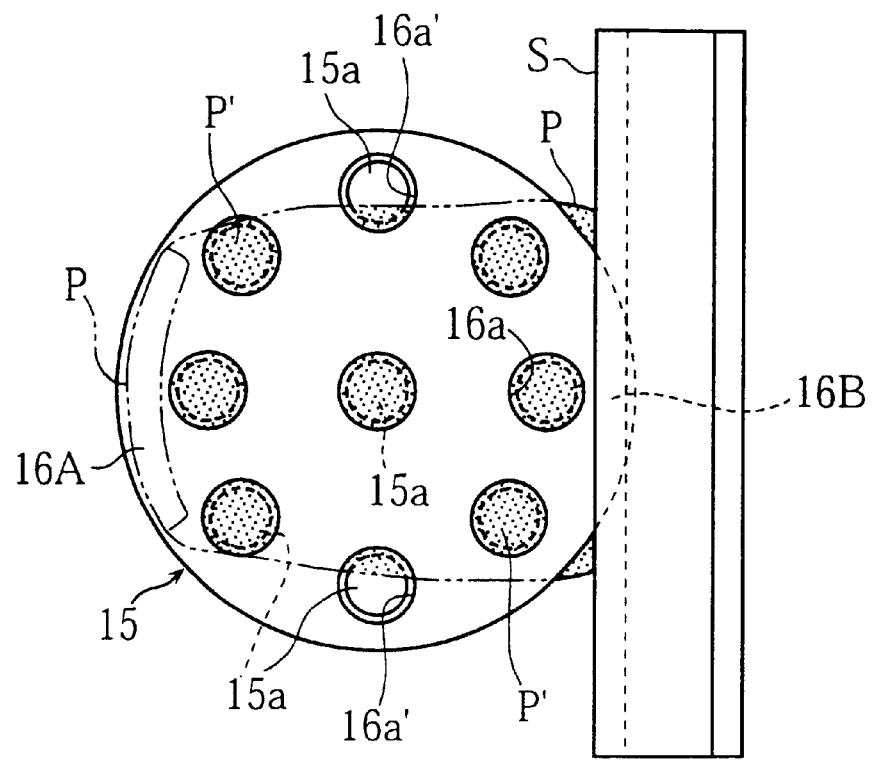

FIG. 17 is a cross section of a multi-chip package (electronic component) X" in which the above-mentioned semiconductor chip 7" carrying the sub-chips 81" and 82" is mounted on a rewiring substrate 9". The rewiring substrate 9" has a structure in which electrode pads 90" corresponding to the first bumps Ba" of the semiconductor chip 7", and a wiring component (not shown) electrically connected thereto, are formed. The electrode pads 90" of the rewiring substrate 9" are electrically connected to the first electrode pads 10a" of the semiconductor chip 7" through the first bumps Ba". The sub-chips 81" and 82" carried on the semiconductor chip 7" via the second bumps Bb" fit between the semiconductor chip 7" and the rewiring substrate 9", which raises the density of the multi-chip package X".

EXAMPLES

The present invention will now be described through examples.

In Examples 1 to 7 and Comparative Examples 1 to 4 we discuss the relationship between the particle diameter of the solder powder in the solder paste, and the variance in the height of the bumps that are formed.

Examples 1~7

A flux vehicle was prepared by mixing 45 g of Polypale (as rosin), 20 g of 2-methyl-2,4-pentanediol and 20 g of diethylene glycol monobutyl ether (as solvents), 10 g of sebacic acid (an organic acid; as an activator), and 5 g of hardened castor oil (as a thixotropic agent). A solder paste was produced by kneading this flux vehicle in a weight ratio of 1:9 with an Sn-3.5%Ag solder powder having the particle size distribution shown in Table 2. This solder paste was used to form solder bumps as below.

An acrylate film with a thickness of 50 μm was formed on a wafer having 30 semiconductor element formation regions provided with 10,000 electrode pads (70×70 μm) at a pitch of 150 μm, and openings with a diameter of 125 μm were formed at positions corresponding to the electrode pads by exposure and developing to create a mask. These openings were filled with the above-mentioned solder paste, and heating was performed at 260° C., which melted the solder paste and integrated the solder to form bumps. The average bump height and the variance here are given in Table 2. Variance in Table 2 is indicated by the standard deviation.

TABLE 2

| Particle size (μm) | Powder 1 | Powder 2 | Powder 3 | Powder 4 | Powder 5 | Powder 6 | Powder 7 |
|---|---|---|---|---|---|---|---|
| >75 | 0 | 0 | 0 | 0 | 0 | 0 | 0 |
| 50 to 75 | 0 | 10 | 8 | 5 | 8 | 8 | 8 |
| 20 to 50 | 30 | 30 | 30 | 30 | 50 | 70 | 90 |
| <20 | 70 | 60 | 62 | 65 | 42 | 22 | 2 |
| Aver. particle size (μm) | 16.0 | 21.0 | 20.0 | 19.0 | 23.0 | 26.0 | 28.0 |
| Viscosity (Pa · s) | 180 | 195 | 200 | 220 | 210 | 190 | 175 |
| Aver. bump height | 71.8 | 72.1 | 72.3 | 72.6 | 70.6 | 70.5 | 70.1 |
| Variance | 1.5 | 1.5 | 1.7 | 1.8 | 1.5 | 1.8 | 1.9 |

Comparative Examples 1~4

A flux vehicle was prepared by mixing 45 g of Polypale (as rosin), 20 g of 2-methyl-2,4-pentanediol and 20 g of diethylene glycol monobutyl ether (as solvents), 10 g of sebacic acid (an organic acid; as an activator), and 5 g of hardened castor oil (as a thixotropic agent). A solder paste was produced by kneading this flux vehicle in a weight ratio of 1:9 with an Sn-3.5%Ag solder powder having the particle size distribution shown in Table 3. This solder paste was used to form solder bumps as below.

An acrylate film with a thickness of 50 μm was formed on a wafer having 30 semiconductor element formation regions provided with 10,000 electrode pads (70 μm diameter) at a pitch of 150 μm, and openings with a diameter of 125 μm were formed at positions corresponding to the electrode pads by exposure and developing to create a mask. These openings were filled with the above-mentioned solder paste, and heating was performed at 260° C., which melted the solder paste and integrated the solder to form bumps. The average bump height and the variance here are given in Table 3. Variance in Table 3 is indicated by the standard deviation.

TABLE 3

| Particle size (μm) | Powder 8 | Powder 9 | Powder 10 | Powder 11 |
|---|---|---|---|---|
| >75 | 1 | 0 | 0 | 5 |
| 50 to 75 | 4 | 0 | 0 | 10 |
| 20 to 50 | 25 | 20 | 0 | 30 |
| <20 | 70 | 80 | 100 | 55 |
| Aver. particle size (μm) | 17.0 | 14.5 | 12.5 | 21.5 |
| Viscosity (Pa · s) | 230 | 250 | 260 | 190 |
| Aver. bump height | 71.5 | 71.8 | 72.0 | 69.8 |
| Variance | 3.3 | 3.4 | 3.6 | 4.2 |

As can be seen from Tables 2 and 3, it is preferable for the solder powder to be such that the proportion of particles whose diameter (50 to 75 μm) is at least the thickness of the mask but no more than 1.5 times the thickness of the mask is no more than 10 wt %, the proportion of particles whose diameter (>50 μm) is at least 40% of the open diameter of the openings is no more than 10 wt %, and the proportion of particles whose diameter (20 to 50 μm) is 40 to 100% of the mask thickness is at least 30 wt %.

In Examples 8 to 11 and Comparative Examples 5 to 8, we will examine the variance in the height of the bumps that are formed as a function of the type of solvent used for the solder paste.

Example 8

A flux vehicle was prepared by mixing 50 g of Polypale (as rosin), 20 g of 2-methyl-2,4-pentanediol (as a first solvent), 20 g of diethylene glycol monobutyl ether (as a second solvent), and 10 g of sebacic acid (an organic acid; as an activator). A solder paste was produced by kneading this flux vehicle in a weight ratio of 1:9 with an Sn-3.5%Ag solder powder with an average particle size of 16 μm (powder 1 in Table 2). This solder paste was used to form solder bumps as below.

Solder bumps were formed by metal mask printing on a wafer having 30 semiconductor element formation regions provided with 10,000 electrode pads (70 μm diameter) at a pitch of 200 μm. First, a metal mask (40 μm thick) having openings with a diameter of 160 μm at positions corresponding to the electrode pads of these semiconductor elements was put in place after being aligned with these semiconductor elements, and the above-mentioned solder paste was printed onto the electrode pads of the wafer. Next, heating was performed at 260° C., which melted the solder paste and integrated the solder to form bumps.

The bumps thus formed were approximately 80 μm tall, and the difference between the maximum and minimum height (hereinafter referred to as "variance") was 1.2 μm, making these bumps very precise. The residue of halogen elements and alkali metal elements in the bumps after this bump formation was 10 ppm or less, and no effect on the semiconductor elements was seen.

Example 9

A flux vehicle was prepared by mixing 55 g of Polypale (as rosin), 15 g of 2-methyl-2,4-pentanediol (as a first solvent), 20 g of diethylene glycol monobutyl ether (as a second solvent), and 10 g of succinic acid (an organic acid; as an activator). A solder paste was produced by kneading this flux vehicle in a weight ratio of 1:9 with an Sn-3.5%Ag solder powder with an average particle size of 16 μm (powder 1 in Table 2) This solder paste was used to form solder bumps as below.

Solder bumps were formed by metal mask printing on a wafer having 30 semiconductor element formation regions provided with 10,000 electrode pads (70 μm diameter) at a pitch of 200 μm. First, a metal mask (40 μm thick) having openings with a diameter of 160 μm at positions corresponding to the electrode pads of these semiconductor elements was put in place after being aligned with these semiconductor elements, and the above-mentioned solder paste was printed onto the electrode pads of the wafer. Next, heating was performed at 260° C., which melted the solder paste and integrated the solder to form bumps.

The bumps thus formed were approximately 78 μm tall, and the variance was 1.3 μm, making these bumps very precise. The residue of halogen elements and alkali metal elements in the bumps after this bump formation was 10 ppm or less, and no effect on the semiconductor elements was seen.

Example 10

A flux vehicle was prepared by mixing 50 g of Polypale (as rosin), 20 g of 2-methyl-2,4-pentanediol (as a first solvent), 20 g of diethylene glycol monobutyl ether (as a second solvent), and 5 g of sebacic acid and 5 g of succinic acid (organic acids; as activators). A solder paste was produced by kneading this flux vehicle in a weight ratio of 1:9 with an Sn-3.5%Ag solder powder with an average particle size of 16 μm (powder 1 in Table 2). This solder paste was used to form solder bumps as below.

Solder bumps were formed by metal mask printing on a wafer having 30 semiconductor element formation regions provided with 10,000 electrode pads (70 μm diameter) at a pitch of 200 μm. First, a metal mask (40 μm thick) having openings with a diameter of 160 μm at positions corresponding to the electrode pads of these semiconductor elements was put in place after being aligned with these semiconductor elements, and the above-mentioned solder paste was printed onto the electrode pads of the wafer. Next, heating was performed at 260° C., which melted the solder paste and integrated the solder to form bumps.

The bumps thus formed were approximately 81 μm tall, and the variance was 1.8 μm, making these bumps very precise. The residue of halogen elements and alkali metal elements in the bumps after this bump formation was 10 ppm or less, and no effect on the semiconductor elements was seen.

Example 11

A flux vehicle was prepared by mixing 45 g of Polypale (as rosin), 20 g of 2-methyl-2,4-pentanediol (as a first solvent), 20 g of diethylene glycol monobutyl ether (as a second solvent), and 10 g of sebacic acid (an organic acid) and 5 g of triethanolamine (an organic amine) (as activators). A solder paste was produced by kneading this flux vehicle in a weight ratio of 1:9 with an Sn-3.5%Ag solder powder with an average particle size of 16 μm (powder 1 in Table 2). This solder paste was used to form solder bumps as below.

Solder bumps were formed by metal mask printing on a wafer having 30 semiconductor element formation regions provided with 10,000 electrode pads (70 μm diameter) at a pitch of 200 μm. First, a metal mask (40 μm thick) having openings with a diameter of 160 μm at positions corresponding to the electrode pads of these semiconductor elements was put in place after being aligned with these semiconductor elements, and the above-mentioned solder paste was printed onto the electrode pads of the wafer. Next, heating was performed at 260° C., which melted the solder paste and integrated the solder to form bumps.

The bumps thus formed were approximately 80 μm tall, and the variance was 1.4 μm, making these bumps very precise. The residue of halogen elements and alkali metal elements in the bumps after this bump formation was 10 ppm or less, and no effect on the semiconductor elements was seen.

Comparative Example 5

A flux vehicle was prepared by mixing 50 g of Polypale (as rosin), 40 g of just 2-methyl-2,4-pentanediol (as a solvent which has a boiling point lower than the melting point of the solder powder), and 10 g of sebacic acid (an organic acid; as an activator). A solder paste was produced by kneading this flux vehicle in a weight ratio of 1:9 with an Sn-3.5%Ag solder powder with an average particle size of 16 μm (powder 1 in Table 2). This solder paste was used to form solder bumps as below.

Solder bumps were formed by metal mask printing on a wafer having 30 semiconductor element formation regions provided with 10,000electrode pads (70 μm diameter) at a pitch of 200 μm. First, a metal mask (40 μm thick) having openings with a diameter of 160 μm at positions corresponding to the electrode pads of these semiconductor elements was put in place after being aligned with these semiconductor elements, and the above-mentioned solder paste was printed onto the electrode pads of the wafer. Next, heating was performed at 260° C.

The result was a solder that produced solder balls in some locations, etc., and could not be integrated when molten. The bumps thus formed averaged about 59 μm in height, and the variance was 9 μm, which is poor precision.

Comparative Example 6

A flux vehicle was prepared by mixing 50 g of Polypale (as rosin), 20 g of 2-methyl-2,4-pentanediol and 20 g of ethylene glycol dibutyl ether (as solvents which have a boiling point lower than the melting point of the solder powder), and 10 g of sebacic acid (an organic acid). A solder paste was produced by kneading this flux vehicle in a weight ratio of 1:9 with an Sn-3.5%Ag solder powder with an average particle size of 16 μm. This solder paste was used to form solder bumps as below.

Solder bumps were formed by metal mask printing on a wafer having 30 semiconductor element formation regions provided with 10,000 electrode pads (70 μm diameter) at a pitch of 200 μm. First, a metal mask (40 μm thick) having openings with a diameter of 160 μm at positions corresponding to the electrode pads of these semiconductor elements was put in place after being aligned with these semiconductor elements, and the above-mentioned solder paste was printed onto the electrode pads of the wafer. Next, heating was performed at 260° C.

The result was a solder that produced solder balls in some locations, etc., and could not be integrated when molten. The bumps thus formed averaged about 50 μm in height, and the variance was 12 μm, which is poor precision.

Comparative Example 7

A flux vehicle was prepared by mixing 50 g of Polypale (as rosin), 40 g of diethylene glycol monobutyl ether (as a solvent which has a boiling point higher than the melting point of the solder powder), and 10 g of sebacic acid (an organic acid; as an activator) A solder paste was produced by kneading this flux vehicle in a weight ratio of 1:9 with an Sn-3.5%Ag solder powder with an average particle size of 16 $\mu$m (powder 1 in Table 2). This solder paste was used to form solder bumps as below.

Solder bumps were formed by metal mask printing on a wafer having 30 semiconductor element formation regions provided with 10,000 electrode pads (70 $\mu$m diameter) at a pitch of 200 $\mu$m. First, a metal mask (40 $\mu$m) having openings with a diameter of 160 $\mu$m at positions corresponding to the electrode pads of these semiconductor elements was put in place after being aligned with these semiconductor elements, and the above-mentioned solder paste was printed onto the electrode pads of the wafer. Next, heating was performed at 260° C.

The result was that solder powder which was unmelted and therefore not integrated remained on the bump surfaces, and the desired bumps could not be formed.

Comparative Example 8

A flux vehicle was prepared by mixing 50 g of Polypale (as rosin), 20 g of 1,5-pentanediol and 20 g of diethylene glycol monobutyl ether (as solvents which have a boiling point higher than the melting point of the solder powder), and 10 g of sebacic acid (an organic acid; as an activator). A solder paste was produced by kneading this flux vehicle in a weight ratio of 1:9 with an Sn-3.5%Ag solder powder with an average particle size of 16 $\mu$m (powder 1 in Table 2). This solder paste was used to form solder bumps as below.

Solder bumps were formed by metal mask printing on a wafer having 30 semiconductor element formation regions provided with 10,000 electrode pads (70 $\mu$m diameter) at a pitch of 200 $\mu$m. First, a metal mask (40 $\mu$m) having openings with a diameter of 160 $\mu$m at positions corresponding to the electrode pads of these semiconductor elements was put in place after being aligned with these semiconductor elements, and the above-mentioned solder paste was printed onto the electrode pads of the wafer. Next, heating was performed at 260° C.

The result was that solder powder which was unmelted and therefore not integrated remained on the bump surfaces, and the desired bumps could not be formed.

In Examples 12 to 20, we will discuss the bump formation method pertaining to the first embodiment described previously.

Example 12

In this example, bumps were formed by the following method. First, a silicon wafer with a thickness of 0.6 mm and a diameter of 6 inches (approximately 15.3 cm), and having 30 semiconductor element formation regions provided with 10,000 electrode pads (70 $\mu$m diameter) at a pitch of 150 $\mu$m, was coated by spin coating with an aqueous solution containing 5.0 wt % polyvinyl alcohol, after which this was heated for 30 minutes at about 110° C. to form a first cover layer with a thickness of about 0.1 $\mu$m. A photosensitive acrylate resin film with a thickness of 50 $\mu$m (trade name: NIT-250, made by Nichigo Morton) was applied by hot press bonding at 105° C. and 3.5 kg/mm² to form a second cover layer.

This second cover layer was exposed through a mask in which the opaque portion was formed at positions corresponding to the electrode pads, and the region irradiated with light was polymerized. The exposed second cover layer was developed with an aqueous solution (etchant) containing 2.3 vol % tetramethylammonium hydroxide, which removed the portions not irradiated with light and created openings with a diameter of 125 $\mu$m. Here, because the previous etchant was an aqueous solution and the first cover layer was formed from a water-soluble resin, the portions corresponding to the electrode pads in the first cover layer were also removed at the same time, and openings were also formed in this first cover layer, exposing the electrode pads.

After this, the openings in the first and second cover layers were filled by printing with an Sn-3.5%Ag solder powder with an average particle size of 16 $\mu$m (powder 1 in Table 2), and the solder was solidified after reflow at 265° C. Next, the first and second cover layers were each dissolved away with a 5.0 vol % monoethanolamine aqueous solution. As a result, bumps 75±1.5 $\mu$m in height were formed.

Example 13

In this example, bumps were formed in the same manner as in Example 12, except that an aqueous solution containing 5.0 wt % polyacrylic acid was applied by spin coating, after which this coating was heated for 30 minutes at about 110° C. to form a first cover layer with a thickness of about 0.1 $\mu$m. As a result, bumps 75±1.5 $\mu$m in height were formed.

Example 14

In this example, first and second cover layers were formed and openings were formed in these cover layers in the same manner as in Example 12. After this, the insides of the openings were coated with flux, then filled with an Sn-3.5%Ag solder powder with an average particle size of 15 $\mu$m (powder 1 in Table 2), and this solder powder was solidified after reflow at 265° C. Next, the first and second cover layers were each dissolved away with a 5.0 vol % monoethanolamine aqueous solution. As a result, bumps 80±2.0 $\mu$m in height were formed.

Example 15

In this example, first and second cover layers were formed and openings were formed in these cover layers in the same manner as in Example 12. The thickness of the second cover layer, however, was changed to 25 $\mu$m. After this, the insides of the through holes were coated with flux, and the substrate was dipped in a 280° C. molten solder bath (Sn-3.5%Ag). The first and second cover layers were each dissolved away with a 5.0 vol % monoethanolamine aqueous solution. As a result, bumps 75±2.5 $\mu$m in height were formed.

Example 16

In this example, first and second cover layers were formed and openings were formed in these cover layers in the same manner as in Example 15. After this, the insides of the openings were filled with solder (Sn-3.5%Ag) by plating and then coated with flux, and this was solidified after reflow at 265° C. The first and second cover layers were each dissolved away with a 5.0 vol % monoethanolamine aqueous solution. As a result, bumps 75±1.0 $\mu$m in height were formed.

Example 17

In this example, bumps were formed by the following method. First, a silicon wafer with a thickness of 0.6 mm and a diameter of 6 inches (approximately 15.3 cm), and on which a total of 300,000 circular electrodes with a diameter of 70 μm had been formed at a pitch of 150 μm, was placed as a substrate on a Teflon substrate support (200×200×2 mm).

Next, a photosensitive acrylate resin film (trade name: NIT-250, made by Nichigo Morton) was applied by hot press bonding at 100° C. and 3.5 kg/mm² to form a cover layer. This cover layer was exposed through a mask in which the opaque portion was formed at positions corresponding to the electrode pads, and the region irradiated with light was polymerized. The exposed cover layer was developed with an aqueous solution (etchant) containing 2.3 vol % tetramethylammonium hydroxide, which removed the portions not irradiated with light, formed openings with a diameter of 125 μm, and created a mask.

After this, a plate with a thickness of 0.6 mm and having an opening of substantially the same shape as the silicon wafer was disposed so as to surround the substrate. The openings in the cover layer were then filled by printing with a solder paste (in which the solder powder was an Sn-3.5%Ag solder powder with an average particle size of 16 μm (powder 1 in Table 2)), after which the plate was taken away and the solder paste was solidified after reflow at 265° C. The first and second cover layers were dissolved away with a 5.0 vol % monoethanolamine aqueous solution. As a result, bumps 75±1.5 μm in height were formed.

Example 18

In this example, a silicon wafer was fixed to a substrate support having an opening corresponding to the plan view surface area of the silicon wafer, and in which a recess 0.45 mm deep was formed, such that the lower part of this wafer fit into this recess. In this state, a cover layer was formed in the same manner as in Example 17, and openings were formed in this cover layer in a pattern corresponding to the electrode pads of the substrate, creating a mask.

Next, a plate with a thickness of 0.15 mm and having an opening of substantially the same shape as the silicon wafer was disposed so as to surround the substrate. The openings were then filled with solder, the solder was solidified after reflow, and the cover layer was removed, all in the same manner as in Example 17. As a result, bumps 75±1.5 μm in height were formed.

Example 19

In this example, other than using a substrate support made from stainless steel, bumps were formed in the same manner as in Example 17. As a result, bumps 75±1.5 μm in height were formed.

Example 20

In this example, other than using a substrate support made from stainless steel, bumps were formed in the same manner as in Example 18. As a result, bumps 75±1.5 μm in height were formed.

In Examples 21 to 23, we will discuss the bump formation method pertaining to the second embodiment of the present invention.

Example 21

800 first electrode pads (used for electrical connection to a rewiring substrate; electrode diameter: 80 μm; pitch: 220 μm) and 100×2 second electrode pads (used for electrical connection to sub-chips; electrode diameter: 110 μm; pitch: 220 μm) were formed on the surface of a chip substrate, and the resulting semiconductor chip was used as a main chip.

A photosensitive polymethyl methacrylate insulating film (thickness: 100 μm) was laid over this main chip so as to cover the first and second electrode pads. Exposure and developing were carried out to form first openings at places corresponding to the first electrode pads in this film, and form second openings at places corresponding to the second electrode pads, creating a mask. The open diameter of the first openings was 200 μm, while that of the second openings was 50 μm. The first and second openings were filled with solder paste containing an Sn-3.5%Ag solder powder with an average particle size of 16 μm (powder 1 in Table 2) in an amount of 55 vol %, after which this was heated at 260° C. to melt and integrate the solder powder in the solder paste.

Next, the insulating film was chemically removed using a 10 wt % monoethanolamine aqueous solution. After this, the bumps were coated with a flux containing 50 wt % Polypale (as rosin) and 50 wt % hexylene glycol (as a solvent), and this was heated again at 260° C. to adjust the shape of the bumps.

As a result, first bumps 161 μm tall were formed on the first electrode pads used for electrical connection to the rewiring substrate, while second bumps 30 μm tall were formed on the second electrode pads used for electrical connection to the sub-chips.

Next, two semiconductor chips (thickness: 100 μm) serving as sub-chips comprising 100 electrode pads on a chip substrate were placed on the second bump group of the main chip, that is, the short bump group in which the height was 30 μm (100 of these bumps), while being heated at 260° C. This main chip was then turned over and placed on a rewiring substrate via the first bumps, that is, the tall bumps with a height of 161 μm, again while being heated at 260° C.

As a result, a good connection was formed between the main chip and the rewiring substrate, while the two sub-chips were held between the main chip and the rewiring substrate.

Example 22

800 first electrode pads (used for electrical connection to a rewiring substrate; electrode diameter: 100 μm; pitch: 300 μm) and 100×2 second electrode pads (used for electrical connection to sub-chips; electrode diameter: 80 μm; pitch: 153 μm) were formed on the surface of a chip substrate, and the resulting semiconductor chip was used as a main chip. A photosensitive polymethyl methacrylate insulating film (thickness: 50 μm) was laid over this main chip so as to cover the first and second electrode pads. Exposure and developing were carried out to form first and second openings at places corresponding to the various electrode pads in this film. The open diameter of the first openings over the first electrode pads was 280 μm, while that of the second openings over the second electrode pads was 50 μm.

The first and second openings were filled with solder paste containing an Sn-3.5%Ag solder powder with an average particle size of 16 μm (powder 1 in Table 2) in an amount of 55 vol %, after which this was heated at 260° C. to melt and integrate the solder powder in the solder paste. Next, the insulating film was chemically removed using a 10 wt % monoethanolamine aqueous solution. After this, the bumps were coated with a flux containing 50 wt % Polypale (as rosin) and 50 wt % hexylene glycol (as a solvent), and this was heated again at 260° C. to adjust the shape of the bumps.

As a result, bumps 154 μm tall were formed on the first electrode pads used for electrical connection to the rewiring substrate, while bumps 28 μm tall were formed on the second electrode pads used for electrical connection to the sub-chips.

Next, two semiconductor chips (thickness: 100 μM) serving as sub-chips comprising 100 electrode pads on a chip substrate were placed on the second bump group of the main chip, that is, the short bump group in which the height was 28 μm (100 of these bumps), while being heated at 260° C. This main chip was then turned over and placed on a rewiring substrate via the first bumps, that is, the tall bumps with a height of 154 μm, again while being heated at 260° C.

As a result, a good connection was formed between the main chip and the rewiring substrate, while the two sub-chips were held between the main chip and the rewiring substrate.

Example 23

800 first electrode pads (used for electrical connection to a rewiring substrate; electrode diameter: 100 μm; pitch: 300 μm) and 100×2 second electrode pads (used for electrical connection to sub-chips; electrode diameter: 80 μm; pitch: 153 μm) were formed on the surface of a chip substrate, and the resulting semiconductor chip was used as a main chip.

A photosensitive polymethyl methacrylate insulating film (thickness: 50 μm) was laid over this main chip so as to cover the electrode pads. Exposure and developing were carried out to first and second openings at places corresponding to the first and second electrode pads in this film. The open diameter of the first openings over the first electrode pads was 280 μm, the open diameter of the number 2-1 openings over the first group of second electrode pads (100 pads) was 50 μm, and the open diameter of the number 2-2 openings over the second group of second electrode pads (100 pads) was 40 μm.

The various openings were filled with solder paste containing an Sn-3.5%Ag solder powder with an average particle size of 16 μm (powder 1 in Table 2) in an amount of 55 vol %, after which this was heated at 260° C. to melt and integrate the solder powder in the solder paste. Next, the insulating film was chemically removed using a 10 wt % monoethanolamine aqueous solution. After this, the bumps were coated with a flux containing 50 wt % Polypale (as rosin) and 50 wt % hexylene glycol (as a solvent), and this was heated again at 260° C. to adjust the shape of the bumps.

As a result, the first bumps 154 μm tall were formed on the first electrode pads used for electrical connection to the rewiring substrate, while bumps 28 μm and 18 μm tall (numbers 2-1 and 2-2) were respectively formed on the first and second groups of second electrode pads used for electrical connection to the sub-chips.

Next, a first semiconductor chip (thickness: 100 μm) and a second semiconductor chip (thickness: 105 μm) serving as sub-chips comprising 100 electrode pads on a chip substrate were respectively placed on the number 2-1 bumps of the main chip, that is, the bumps 28 μm tall (100 of these bumps), and on the number 2-2 bumps, that is the bumps 18 μm tall (100 of these bumps), while being heated at 260° C. This main chip was then turned over and placed on a rewiring substrate via the first bumps, that is, the tall bumps with a height of 154 μm, again while being heated at 260° C.

As a result, a good connection was formed between the main chip and the rewiring substrate, while the two sub-chips were held between the main chip and the rewiring substrate.

What is claimed is:

1. A bump formation method in which bumps are formed on a substrate provided with a plurality of electrode pads, comprising the steps of:

providing a mask having a plurality of openings corresponding to the plurality of electrode pads;

filling each of the openings with a solder paste; and heat treating the solder paste, wherein the solder paste contains solder powder and a flux vehicle, and the solder powder contains no more than 10 wt % particles whose diameter is greater than the thickness of the mask and no more than 1.5 times this thickness.

2. A bump formation method as claimed in claim 1, wherein the solder powder contains no more than 10 wt % particles whose diameter is no less than 40% of the diameter of the openings.

3. A bump formation method as claimed in claim 1, wherein the solder powder contains no more than 30 wt % particles whose diameter is 40 to 100% the thickness of the mask.

4. A bump formation method as claimed in claim 1, wherein the average particle diameter of the solder powder is 5 to 20 μm.

5. A bump formation method as claimed in claim 1, wherein the flux vehicle contains a first solvent having a boiling point lower than the melting point of the solder powder, and a second solvent having a boiling point higher than the melting point of the solder powder.

6. A bump formation method as claimed in claim 5, wherein the boiling point of the first solvent is 5 to 50° C. lower than the melting point of the solder powder, and the boiling point of the second solvent is 5 to 50° C. higher than the melting point of the solder powder.

7. A bump formation method as claimed in claim 5, wherein the first solvent is contained in the solder paste in an amount of 2 to 6 wt %, and the second solvent is contained in an amount of 2 to 6 wt %.

8. A bump formation method as claimed in claim 1, wherein the total content of halogen elements and alkali metal elements in the flux vehicle is no more than 100 ppm.

9. A bump formation method as claimed in claim 1, wherein the flux vehicle further contains an activator, and this activator contains at least one type of organic acid or organic amine selected from the group consisting of sebacic acid, succinic acid, adipic acid, glutaric acid, triethanolamine, and monoethanolamine.

10. A bump formation method as claimed in claim 9, wherein the activator is contained in the solder paste in an amount of 0.01 to 2 wt %.

11. A bump formation method as claimed in claim 1, wherein the viscosity of the solder paste is 100 to 400 Pa·s.

12. A bump formation method as claimed in claim 1, wherein the mask is provided over the substrate through the steps of forming a first cover layer over the substrate, forming a second cover layer over this first cover layer, and forming the plurality of openings in the first cover layer and the second cover layer by exposing these to light in a pattern corresponding to the plurality of electrode pads and developing with an etchant, and the first cover layer is formed from a material that will be dissolved by the etchant used to develop the second cover layer, with the etching of the first cover layer being carried out simultaneously with the developing of the second cover layer.

13. A bump formation method as claimed in claim 12, wherein the first cover layer is formed from a material containing a macromolecule that is water-soluble or readily dissolves in an alkaline aqueous solution.

14. A bump formation method as claimed in claim 1, wherein the plurality of electrode pads are divided into a plurality of groups, and the mask is formed through the steps of forming a cover layer so as to cover the plurality of electrode pads, and forming the plurality of openings in this cover layer in a pattern corresponding to the plurality of electrode pads, with the volume of these openings being different for each group.

15. A bump formation method as claimed in claim 14, wherein the cover layer is formed by laying a resin film over the substrate.

16. A bump formation method as claimed in claim 14, wherein the cover layer contains at least one type of component selected from the group consisting of polymethyl methacrylate, polyacrylate, and polymethyl isopropenyl ketone.

17. A bump formation method as claimed in claim 14, wherein the plurality of electrode pads are divided into a group comprising a plurality of first electrode pads and a group comprising a plurality of second electrode pads, each of the first electrode pads being formed in a surface area smaller than each of the second electrode pads, and the plurality of openings include a plurality of first openings formed in a pattern corresponding to the plurality of first electrode pads, and a plurality of second openings each smaller in volume than each of the first openings and formed in a pattern corresponding to the plurality of second electrode pads.

18. A bump formation method as claimed in claim 1, wherein the plurality of electrode pads include a plurality of first electrode pads and a plurality of second electrode pads, and the plurality of openings include a plurality of first openings, a plurality of second openings, and a plurality of third openings, and the mask is formed through the steps of forming a first cover layer by covering the plurality of first electrode pads and exposing the plurality of second electrode pads, forming the plurality of first openings in this first cover layer in a pattern corresponding to the plurality of first electrode pads, forming a second cover layer so as to cover the first cover layer and the plurality of second electrode pads, forming the plurality of second openings in the second cover layer in a pattern corresponding to the plurality of second electrode pads, and forming the plurality of third openings in a pattern corresponding to the plurality of first openings.

19. A bump formation method as claimed in claim 18, wherein each of the first openings is formed with a larger open surface area than each of the second openings.

20. A bump formation method as claimed in claim 18, wherein each of the third openings is formed with a larger open surface area than each of the first openings, there is further included a step of selectively removing just the second cover layer, and the first cover layer is left on the substrate.

21. A bump formation method as claimed in claim 18, wherein the first cover layer or the second cover layer, or both, is or are formed by laying a resin film over the substrate.

22. A bump formation method as claimed in claim 18, wherein the first cover layer contains at least one type of compound selected from the group consisting of epoxyacrylate, epoxy, and polyimide.

23. A bump formation method as claimed in claim 18, wherein the second cover layer contains at least one type of compound selected from the group consisting of polymethyl methacrylate, polyacrylate, and polymethyl isopropenyl ketone.

24. A bump formation method as claimed in claim 1, wherein the filling of the openings with solder paste is carried out through the steps of holding the substrate on a substrate support, providing squeegeeing helper means for lessening the difference between the height position of the mask and the height position of the periphery of the substrate, readying solder paste on the mask or the squeegeeing helper means, and moving a squeegee to push the solder paste down into the openings.

25. A bump formation method as claimed in claim 24, wherein the height position of the periphery of the substrate is made by the squeegeeing helper means to be the same or substantially the same as the height position of the cover layer.

26. A bump formation method as claimed in claim 24, wherein the squeegeeing helper means is a plate having an opening corresponding to the shape of the substrate.

27. A bump formation method as claimed in claim 24, wherein the substrate support has a recess capable of accommodating at least part of the substrate.

28. A bump formation method as claimed in claim 1, further comprising a step of applying flux to the bumps formed from heat treated solder paste, and performing a heat treatment again to adjust the shape of the bumps.

29. A bump formation method as claimed in claim 28, wherein the flux contains Polypale and hexylene glycol.

30. A bump formation method as claimed in claim 1, wherein the open surface area of each of the openings is no more than 25 times the surface area of the corresponding electrode pad.

31. A bump formation method for forming bumps on a substrate provided with a plurality of electrode pads, comprising the steps of:

forming a first cover layer over the substrate;

forming a second cover layer over the first cover layer;

forming a plurality of openings corresponding to the plurality of electrode pads in the first cover layer and the second cover layer by exposing these to light and developing with an etchant;

filling each of the openings with metal; and heating the metal to integrate it with the electrode pads, wherein the first cover layer is formed from a material that will be dissolved by the etchant used to develop the second cover layer, and the first cover layer is etched to form the plurality of openings simultaneously with the developing of the second cover layer.

32. A bump formation method for forming bumps on a substrate provided with a plurality of electrode pads divided into a plurality of groups, comprising the steps of:

forming a mask having a plurality of openings corresponding to the plurality of electrode pads such that the size of respective openings is different for each group, the mask having a peripheral edges entirely surrounding all of the electrode pads;

filling the openings with solder paste;

forming bumps from the solder paste by heat treatment; and removing the mask from the substrate.

33. A bump formation method for forming bumps on a substrate provided with a plurality of first electrode pads and a plurality of second electrode pads, comprising the steps of:

forming a first cover layer in a state in which the plurality of first electrode pads are covered and the plurality of second electrode pads are exposed;

forming a plurality of first openings in the first cover layer in a pattern corresponding to the plurality of first electrode pads;

forming a second cover layer so as to cover the first cover layer and the plurality of second electrode pads;

forming a plurality of second openings in the second cover layer in a pattern corresponding to the plurality of second electrode pads, and forming a plurality of third openings in a pattern corresponding to the plurality of first openings;

filling the first openings, second openings, and third openings with solder paste; and forming bumps from the solder paste by heat treatment.

34. A bump formation method for forming bumps on a substrate provided with a plurality of electrode pads, comprising the steps of:

holding the substrate on a substrate support;

forming a cover layer so as to cover at least the substrate;

forming a plurality of openings in the cover layer in a pattern corresponding to the plurality of electrode pads;

providing squeegeeing helper means on the cover layer for lessening the difference between the heigh position of the cover layer on the substrate and the height position of the periphery of the substrate;

readying a metal paste or metal powder on the cover layer or the squeegeeing helper means;

moving a squeegee to push the metal paste or metal powder down into the openings while also bring an excess of the metal paste or metal powder onto the squeegeeing helper means;

heating, melting, and solidifying the metal paste or metal powder in the openings to integrate the same on the electrode pads; and taking away the squeegeeing helper means together with the excess of the metal paste or powder.

\* \* \* \* \*